United States Patent
Rösner et al.

(10) Patent No.: US 6,320,447 B1
(45) Date of Patent: Nov. 20, 2001

(54) CIRCUIT CONFIGURATION WITH SINGLE-ELECTRON COMPONENTS, AND OPERATING METHOD

(75) Inventors: Wolfgang Rösner; Ties Ramcke, both of München; Lothar Risch, Neubiberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/707,032

(22) Filed: Nov. 6, 2000

Related U.S. Application Data

(63) Continuation of application No. PCT/DE99/00715, filed on Mar. 15, 1999.

(30) Foreign Application Priority Data

May 5, 1998 (DE) .............................................. 198 20 050

(51) Int. Cl.[7] .................................................. H03K 17/62
(52) U.S. Cl. ........................................... 327/407; 327/355
(58) Field of Search .................................... 327/403, 404, 327/405, 407, 408, 411, 99, 427, 355; 326/114

(56) References Cited

U.S. PATENT DOCUMENTS

| | | | |
|---|---|---|---|
| 5,677,637 | * 10/1997 | Nakarato et al. | 326/35 |
| 5,838,021 | * 11/1998 | Ancona | 257/30 |

FOREIGN PATENT DOCUMENTS

| | | |
|---|---|---|
| 42 12 220 A1 | 10/1993 | (DE) . |
| 0 562 751 A2 | 9/1993 | (EP) . |

OTHER PUBLICATIONS

"Single–electron transistor logic", XP 000585115 (Chen et al.), dated Apr. 1, 1996, American Institute of Physics, pp. 1954–1956.

"Stable Operation of Single Electron Logic Circuits with Feed–Back Loop" (Masu et al.), dated Aug. 21, 1995, 2419A International Conference on Solid State Devices and Materials, pp. 1079–1080.

Published International Application No. WO 99/12212 (Rösner et al.), dated Mar. 11, 1999.

\* cited by examiner

*Primary Examiner*—Toan Tran
(74) *Attorney, Agent, or Firm*—Herbert L. Lerner; Laurence A. Greenberg; Werner H. Stemer

(57) ABSTRACT

The circuit configuration has at least five single-electron transistors, three of which are connected via a second main node and a third main node between a first main node and an output. The fourth single-electron transistor is connected between the second main node and a first supply voltage, with its gate electrode being connected to the first main node. The fifth single-electron transistor is connected between the third main node and the first supply voltage, with its gate electrode being connected to the second main node. The circuit configuration is suitable for use as a full adder and as a multiplier.

8 Claims, 20 Drawing Sheets

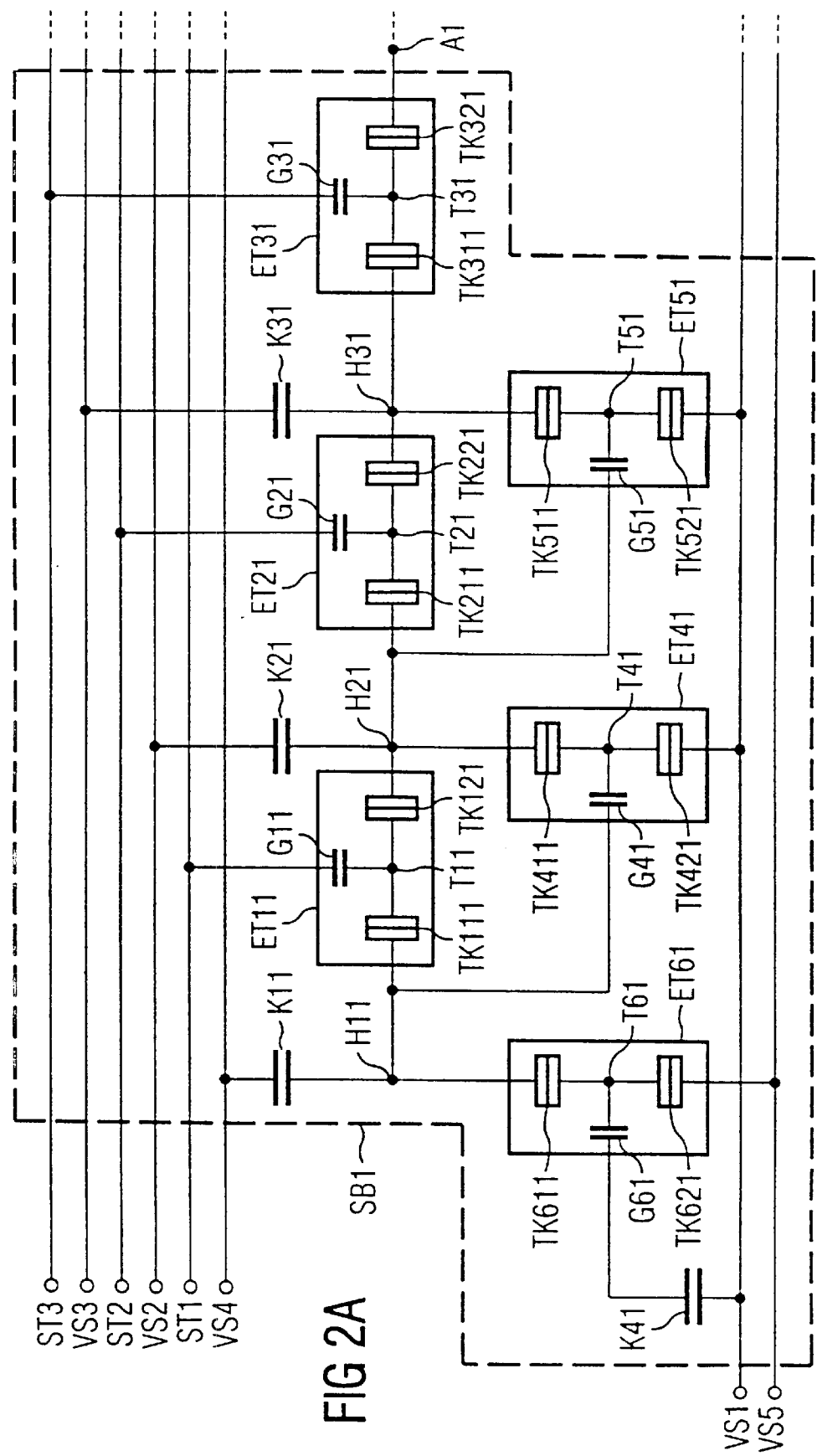

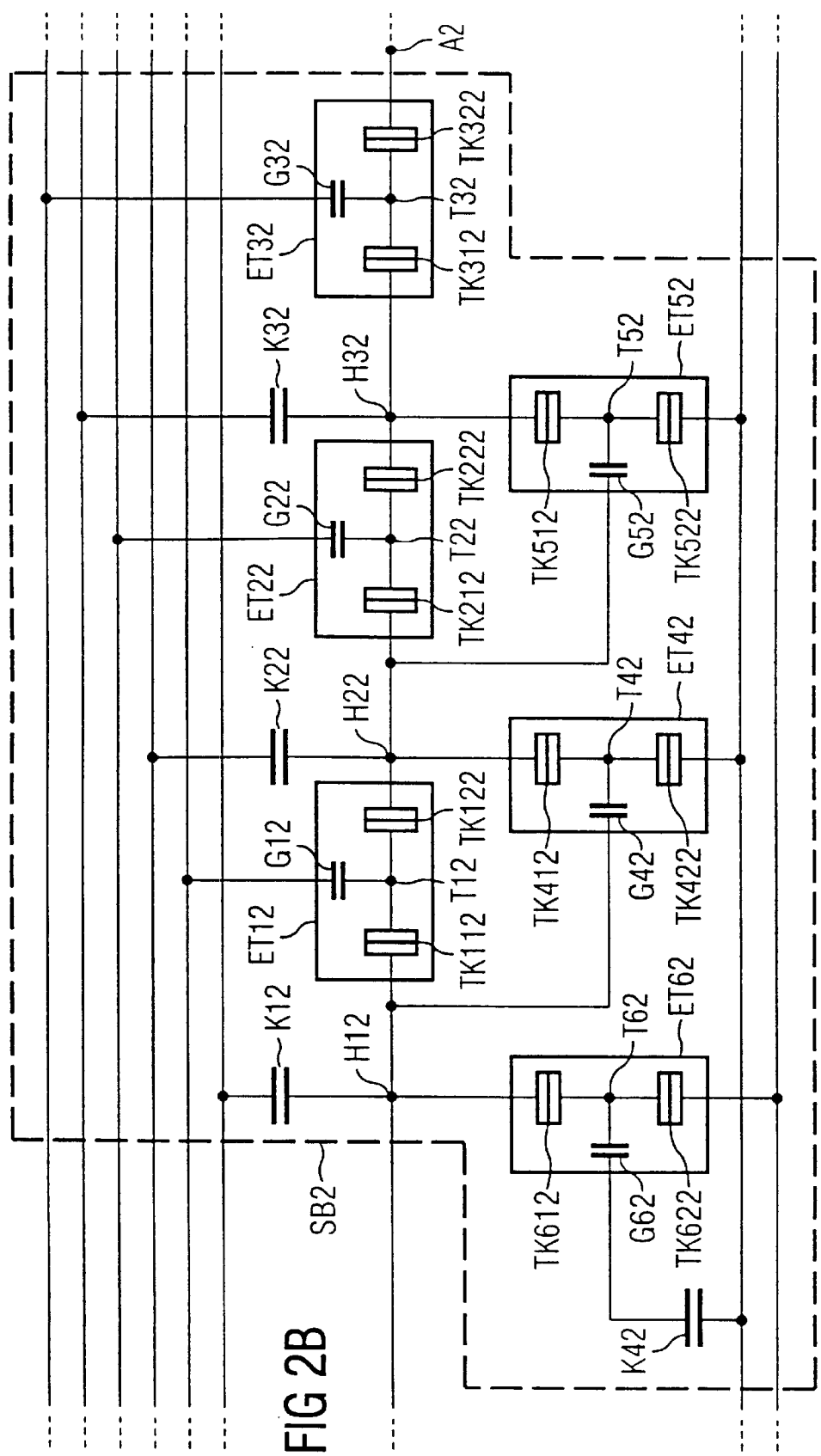

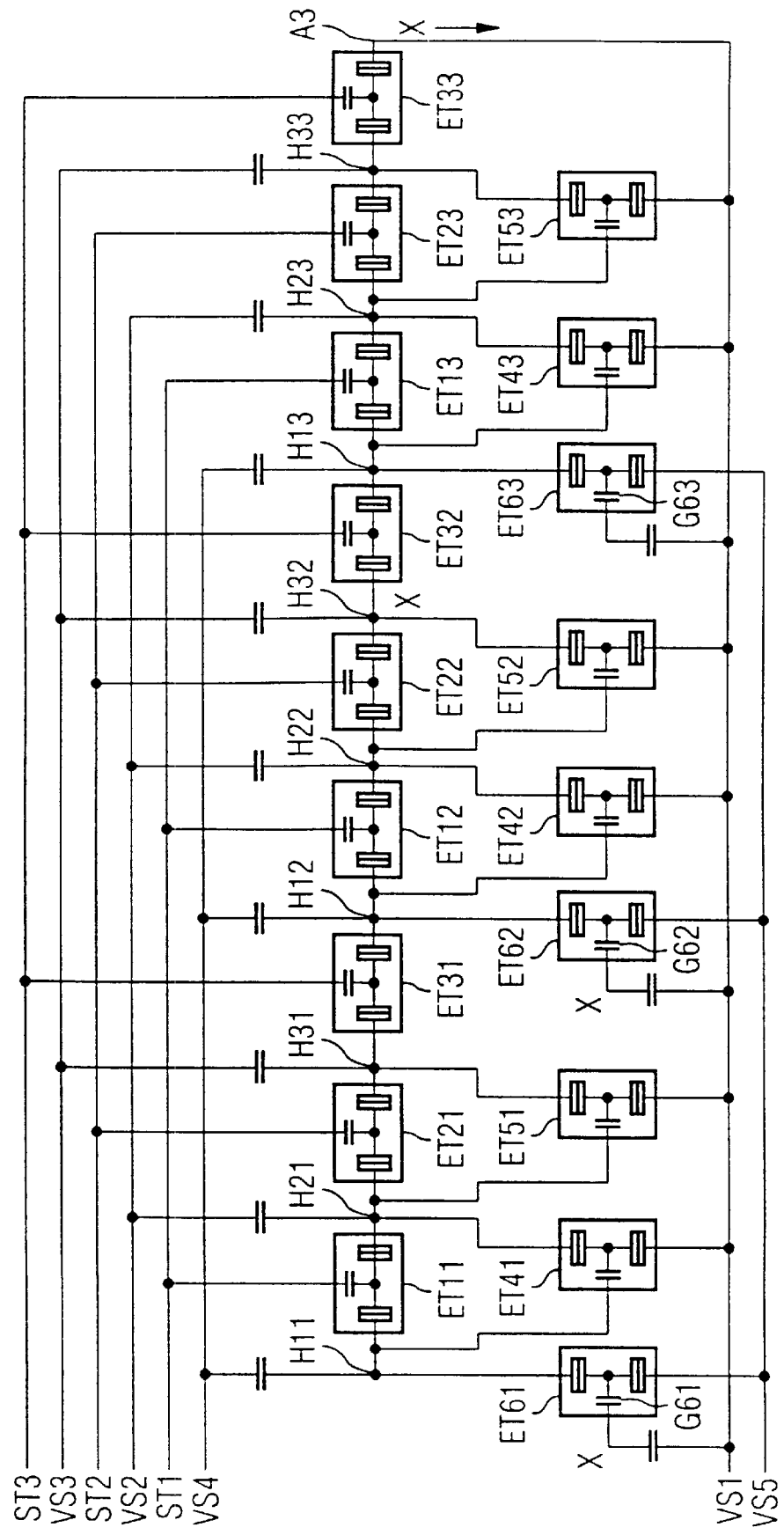

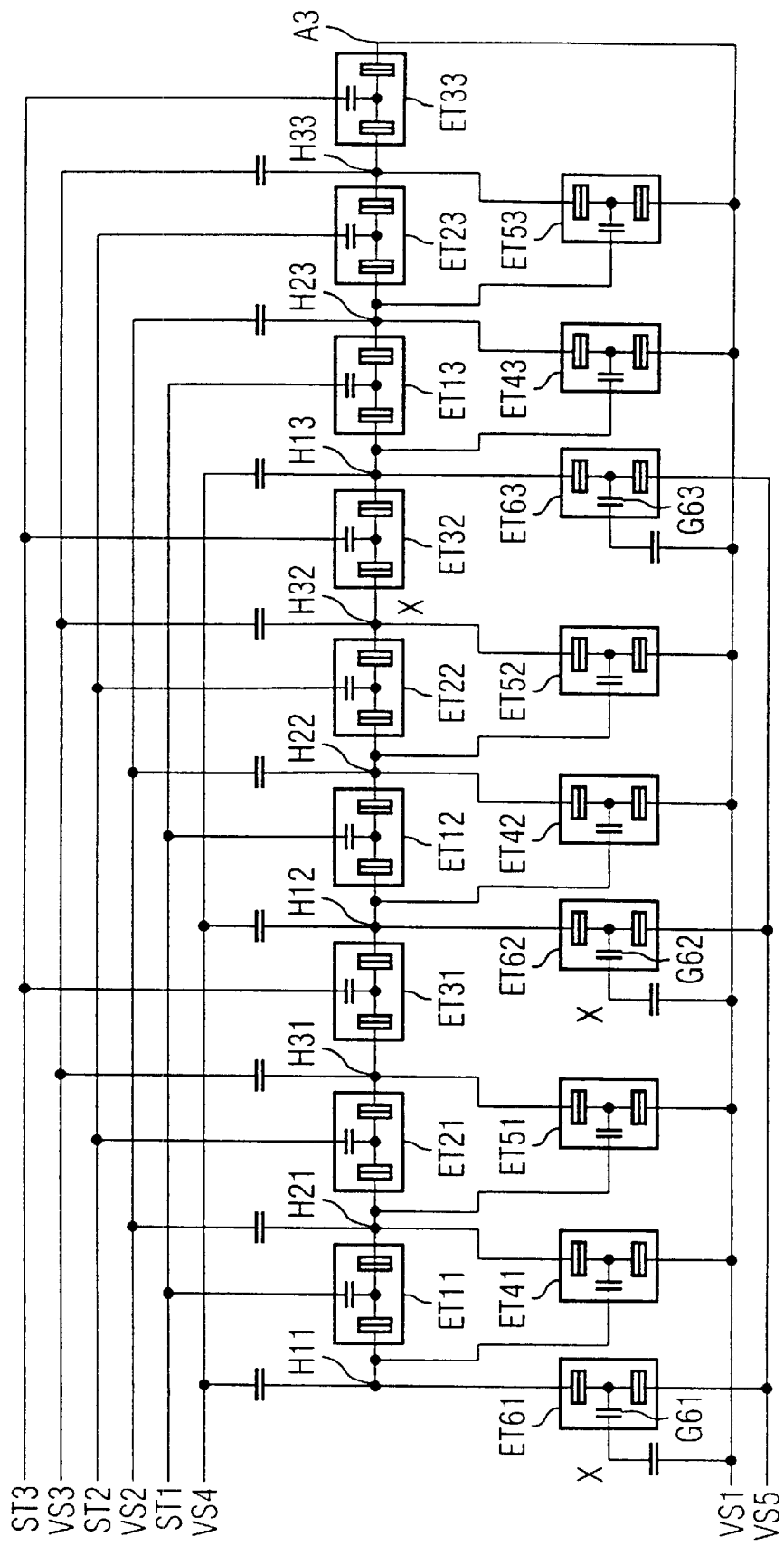

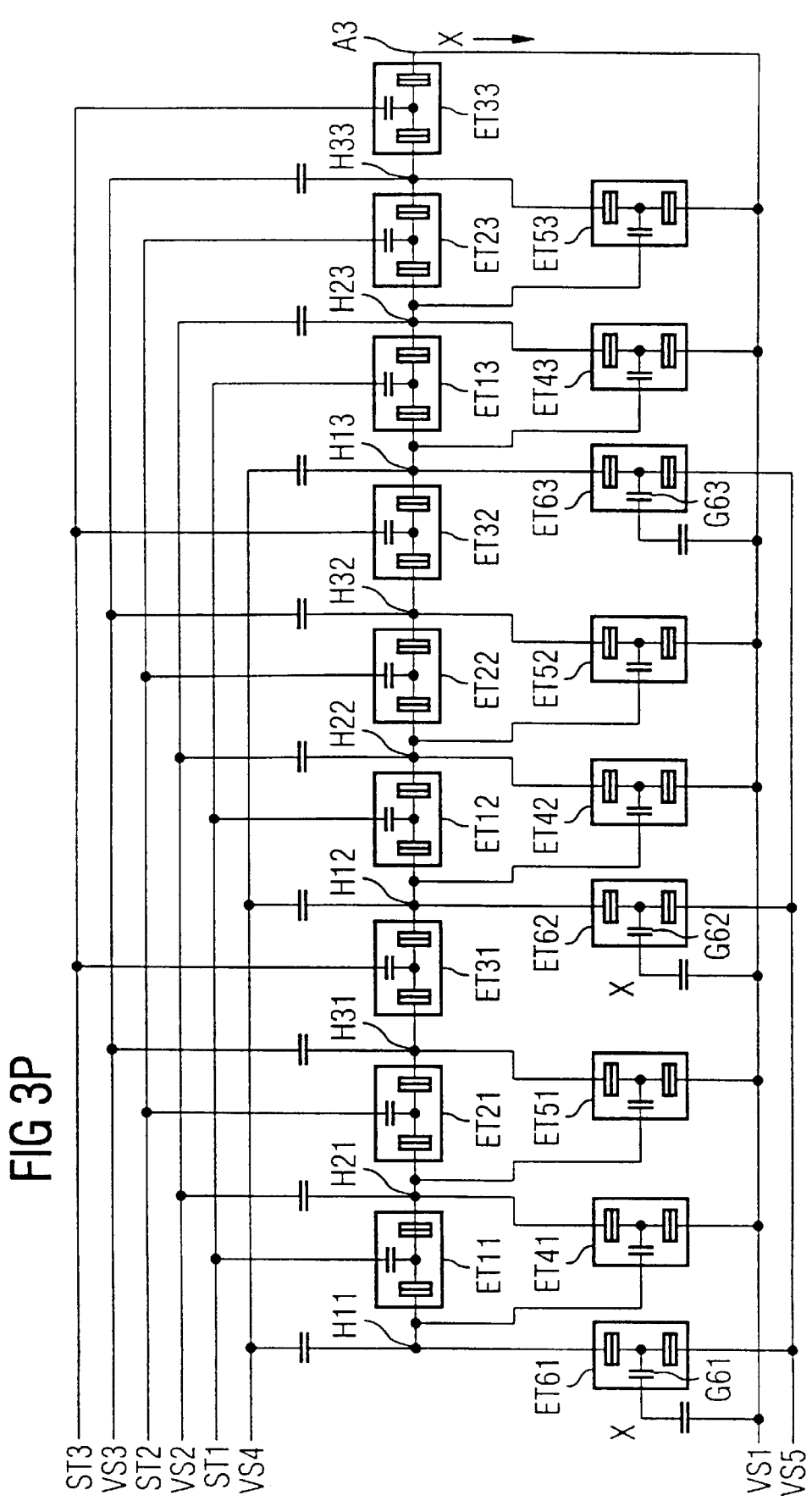

CIRCUIT CONFIGURATION WITH SINGLE-ELECTRON COMPONENTS, AND OPERATING METHOD

CROSS-REFERENCE TO RELATED APPLICATION

This is a continuation of copending international application PCT/DE99/00715, filed Mar. 15, 1999, which designated the United States.

BACKGROUND OF THE INVENTION

1. Field of the Invention

The invention relates to a circuit configuration having single-electron components and which is suitable, inter alia, for use as a logic circuit.

Present-day integrated circuit configurations for logic applications generally use CMOS technology. As components progressively become smaller, conventional CMOS technology is reaching its limits.

With regard to further miniaturization, so-called single-electron components have been proposed. There, switching processes are carried out using individual electrons. An investigation into such single-electron components is known, for example, from Rosner, et al., Microelectronic Engineering, Volume 27, 1995, pages 55–58. Single-electron components are tunnel elements which are connected to adjacent connections via tunneling contacts. Charge movements through these tunneling contacts take place both by means of the quantum-mechanics tunnel effect and simply by thermally overcoming a potential barrier, in which these charge movements occur sufficiently rarely. The tunnel elements are, for example, in the form of small conductive islands, which are surrounded by an insulating structure. If a voltage U which satisfies the conditions for Coulomb blockade is applied to the two connections, that is to say whose magnitude is $|U|<e/(2C)$, then the charge of the tunnel element cannot change, owing to the potential conditions, as long as the following is true for the thermal energy $$\frac{kT}{e} \ll \frac{e}{2C}.$$

Here, k is the Stefan-Boltzmann constant, T is the temperature, e is the electron charge, and C is the capacitance of the tunnel element.

If a greater voltage is applied, electrons can flow via one of the tunneling contacts to the tunnel element. These single-electron components are operated such that individual electrons move in each case.

By actuating the tunnel element via a gate electrode which capacitively influences the tunnel element without any tunnel movements occurring in the operating voltage range, it is possible to overcome the Coulomb trap or blockade. If the electrical charge acting at the gate electrode is suitable, the single-electron component has an approximately linear current/voltage characteristic, passing through the origin. Such a gate-controlled single-electron component is referred to as a single-electron transistor in the pertinent literature.

SUMMARY OF THE INVENTION

The object of the invention is to provide a configuration having single-electron components which overcomes the above-noted deficiencies and disadvantages of the prior art devices and methods of this kind, and which is suitable, inter alia, for use as a logic circuit, as well as an operating method for such a circuit configuration.

With the above and other objects in view there is provided, in accordance with the invention, a circuit configuration with single-electron components, comprising:

a first supply voltage connection, a second supply voltage connection, a third supply voltage connection, a fourth supply voltage connection, a fifth supply voltage connection, an output, a first control voltage connection, a second control voltage connection, and a third control voltage connection;

a circuit block having a first single-electron transistor, a second single-electron transistor, a third single-electron transistor, a fourth single-electron transistor, and a fifth single-electron transistor;

wherein the first single-electron transistor is connected between a first main node and a second main node, the second single-electron transistor is connected between the second main node and a third main node, and the third single-electron transistor is connected between the third main node and the output;

wherein the fourth single-electron transistor is connected between the second main node and the first supply voltage connection, and the fifth single-electron transistor is connected between the third main node and the first supply voltage connection;

wherein the second main node is capacitively connected to the second supply voltage connection, and the third main node is capacitively connected to the third supply voltage connection;

the first single-electron transistor having a gate electrode connected to the first control voltage connection, the second single-electron transistor having a gate electrode connected to the second control voltage connection, and the third single-electron transistor having a gate electrode connected to the third control voltage connection;

the fourth single-electron transistor having a gate electrode connected to the first main node, and the fifth single-electron transistor having a gate electrode connected to the second main node; and wherein the first main node is capacitively connected to the fourth supply voltage connection, a capacitive element is connected between the first main node and the fifth supply voltage connection, and the fifth supply voltage connection is different from the first supply voltage connection.

In other words, the circuit configuration has at least one circuit block having a first single-electron transistor, a second single-electron transistor, a third single-electron transistor, a fourth single-electron transistor and a fifth single-electron transistor. The first single-electron transistor, the second single-electron transistor and the third single-electron transistor are thereby connected in series between a first main node and an output. In this case, a second main node is provided between the first single-electron transistor and the second single-electron transistor, and a third main node is provided between the second single-electron transistor and the third-single-electron transistor.

The fourth single-electron transistor is connected between the second main node and a first supply voltage connection, and the fifth single-electron transistor is connected between the third main node and the first supply voltage connection. The second main node is in this case capacitively connected to a second supply voltage connection, and the third main node is capacitively connected to a third supply voltage connection.

The gate electrode of the first single-electron transistor is connected to a first control voltage connection, the gate electrode of the second single-electron transistor is connected to a second control voltage connection, and the gate electrode of the third single-electron transistor is connected to a third control voltage connection. The gate electrode of the fourth single-electron transistor is connected to the first main node, and the gate electrode of the fifth single-electron transistor is connected to the second main node. The first main node is capacitively connected between a fourth supply voltage connection and a fifth supply voltage connection, with the first supply voltage connection being different to the fifth supply voltage connection.

The single-electron transistors each have a tunnel element, which is connected via two tunneling contacts to connections and can be influenced capacitively via a gate electrode. Since the level of the potential barrier between the two connections depends on the amount of charge present at the gate electrode, and since any charge located at the first main node acts on the gate electrode of the fourth single-electron transistor and any charge located at the second main node acts on the gate electrode of the fifth single-electron transistor, this circuit configuration allows logic links to be set up between signal charges which are located at the first main node, the second main node and the third main node, and which represent the logic data. To this end, charge carriers which are associated with the corresponding logic value are applied to the first main node, to the second main node and/or to the third main node. For example, an electron is associated with the logic value one, and no electron is associated with the logic value zero.

Charge carrier movements can take place via the tunneling contacts of the single-electron transistors both by the quantum-mechanical tunnel effect and by sufficiently rare thermal overcoming of a potential barrier. If the tunnel resistance of the tunneling contacts is $R_T > R_K = h/e^2 \approx 26$ k$\Omega$ where $R_K$ is the Klitzing resistance, h is the Planck constant, and e is an electron charge, then the charge carriers are localized on one of the sides of the potential barrier, and the majority of the charge movements across the potential barrier take place by elementary processes. The tunnel resistance of each of the tunneling contacts is preferably >100 k$\Omega$.

All structures which comprise an electrically conductive region and are insulated via an insulation structure from adjacent electrically conductive regions may be used as tunnel elements. The electrically conductive regions are connected through the insulation structure by means of tunneling contacts. Structures which comprise a conductive core and an insulating sheath surrounding the conductive core are particularly suitable for use as a tunnel element. The diameter of the tunnel element is in this case preferably between 1 and 10 nm. The capacitance of tunnel elements of this order of magnitude is sufficiently low that the circuit configuration operates in the room-temperature range. Metal clusters having organic ligands as an insulating sheath, as are known from German patent application DE 42 12 220 A1 (see U.S. Pat. No. 5,350,930), or fullerene with an enclosed metal core are particularly suitable as tunnel elements.

Furthermore, lithographically structured metal layers are suitable as tunnel elements, with the tunneling contacts being produced by oxidation of such a metal layer, and subsequent deposition and structuring of a further metal layer.

Furthermore, Delta-doped III-V semiconductors are suitable as tunnel elements. In the context of molecular electronics, sections of individual molecules are also suitable as tunnel elements, and may carry different charges, depending on their previous history. The charge movement between such rechargeable molecule sections takes place along chemical bonds.

The circuit configuration allows, in particular, an OR link, an AND link and an XOR link to be produced. Furthermore, the circuit configuration is suitable for addition of values which are stored at the first main node, at the second main node and/or at the third main node. Since the circuit configuration is suitable for addition of three single-digit binary numbers, it represents a full adder. An adder for binary numbers of any desired length can be constructed by providing a plurality of circuit blocks, which are essentially constructed in the same way as the first-mentioned circuit block, and in each of which the output of the one circuit block is connected to the first main node of the adjacent circuit block.

The connection between the second main node and the second supply voltage connection, and the connection between the third main node and the third supply voltage connection are provided, for example, via a capacitor. Alternatively, this connection can be provided by some other capacitive element, for example a single-electron component or a single-electron transistor.

A sixth single-electron transistor is preferably provided in the circuit block, and is connected between the first main node and the fifth supply voltage connection. In this arrangement, the first main node can be charged via the sixth single-electron transistor. The charge flowing to the first main node is in this case dependent on the charge acting on the gate electrode of the sixth single-electron transistor, and on the charge acting on the fifth supply voltage connection. A logic link between the charge acting on the gate electrode of the sixth single-electron transistor and the charge acting on the fifth supply voltage connection is thus possible via the sixth single-electron transistor. In other words, in this configuration, the first main node has applied to it the result of the link between two values whose associated charges act on the gate electrode of the sixth single-electron transistor and on the fifth supply voltage connection.

The gate electrode of the sixth single-electron transistor is preferably capacitively connected to the first supply voltage connection. In this case, a charge, and thus a logic value, can be permanently stored at the gate electrode of the sixth single-electron transistor.

The connection between the gate electrode of the sixth single-electron transistor and the first supply voltage connection, and the connection between the first main node and the fourth supply voltage connection are each provided, for example, via a capacitor or some other capacitive element.

In accordance with a refinement of the invention, a plurality of circuit blocks are provided, which are constructed in the same way as the first-mentioned circuit block and are connected in series, so that the output of one of the circuit blocks is connected to the first main node of the adjacent circuit block. This refinement of the circuit configuration is suitable for use as full adder, with the corresponding digits of two binary numbers to be added respectively being applied to the first main node and to the second main node of one of the circuit blocks. n circuit blocks are in this case required for addition of two binary numbers with a maximum of n digits. For addition of binary numbers, it is sufficient for the circuit blocks each to have five single-electron transistors.

If the circuit blocks have six single-electron transistors, then this refinement of the invention is suitable for use as a multiplier of binary numbers. n circuit blocks are required for multiplication of two binary numbers having a maximum of n digits. In order to multiply a first binary number by a second binary number, the digits of the first binary number are each stored at the gate of the sixth single-electron transistor. The digits of the second binary number are applied in serial form to the fifth supply voltage connection. The first main node then has applied to it, by means of the link with the aid of the sixth single-electron transistor, a signal charge which corresponds to the product of the two respective digits of the first binary number and of the second binary number.

A number of charge carriers corresponding to the logic value of variables to be linked is in each case preferably applied to the first main node, to the second main node and to the third main node, for operation of the circuit configuration. In the process, an electron is applied for the logic value one, for example, and no electron is applied for the logic value zero. Depending on the logic value of the variable stored at the respective main node, there are either excess charge carriers at the node, or no excess charges carriers at the main node.

A logical link between the variables is formed by a combination of basic processes. In this case, in a first basic process, the gate electrode of the first single-electron transistor is actuated such that excess charge carriers located at the first main node flow to the second main node, provided there are not already any excess charge carriers at the second main node, and such that excess charge carriers located at the first main node flow to the tunnel element of the first single-electron transistor, provided there are excess charge carriers at the second main node. The gate electrode of the first single-electron transistor is then actuated such that excess charge carriers located at the tunnel element of the first single-electron transistor flow to the first main node. The second supply voltage connection is then actuated such that excess charge carriers located at the second main node flow away via the fourth single-electron transistor only when there is a signal charge at the first main node. This step element makes use of the fact that the gate electrode of the fourth single-electron transistor is connected to the first main node. The first two step elements of the first basic process make use of the fact that the level of the potential barriers in the first single-electron transistor is dependent on the charge acting at the second main node.

The first basic process results in the formation of the sum of the variables stored at the first main node and at the second main node.

The sum of variables stored at the second main node and at the third main node is formed in a second basic process. This is done in an analogous way to the first basic process, with the gate electrode of the second single-electron transistor being actuated such that excess charge carriers located at the second main node flow to the third main node, provided there are not already any excess charge carriers at the third main node, and such that excess charge carriers located at the second main node flow to the tunnel element of the second single-electron transistor, provided there are excess charge carriers at the third main node.

The gate electrode of the second single-electron transistor is then actuated such that excess charge barriers located at the tunnel junction of the second single-electron transistor flow to the second main node. The third supply voltage connection is then actuated such that a signal charge located at the third main node flows away via the fifth single-electron transistor only when there are excess charge carriers at the second main node.

The sum of the variables stored at the second main node and at the third main node is formed in the second basic process.

In a third basic process, a signal charge is shifted from a main node by actuation of the single-electron transistor located between the adjacent main nodes. This shifting of the excess charge carriers takes place not only from the first main node to the second and from the second main node to the third, but also from the third main node to the first main node of the adjacent circuit block, or from the third main node to the output of the last circuit block.

In order to multiple a first binary number by a second binary number, the digits of the first binary number are applied to the gate electrodes of the first single-electron transistor of the adjacent circuit blocks. The digit of the second binary number is then applied to the first supply voltage connection successively for all the digits of the second binary number, so that the first main node is provided with an amount of charge that depends on the product of the corresponding digits of the binary numbers. The first basic process, the second basic process and the first basic process once again are then carried out for the digit. After this, by applying the third basic process to the third single-electron transistor, to the second single-electron transistor and to the first single-electron transistor a number of times, a signal charge located at the third main node is shifted to the second main node of the adjacent circuit block, and a signal charge located at the second main node is shifted to the third main node of the same circuit block. At the same time, a signal charge located at the third main node in the last circuit block is shifted, to the output of the last circuit block, as the result for the corresponding binary digit.

In this procedure, the sum of the variables in the first main node and in the second main node is formed by carrying out the first basic process, after which the sum of the variables stored in the second main node and in the third main node is formed. The repeated use of the first basic process results in the first main node being provided with a zero. In doing so, use is made of the fact that any one can in each case be stored, as a maximum, at the first main node, at the second main node and at the third main node. The sum of the first main node and the second main node results in a maximum of a one in the first main node and a zero in the second main node. The subsequent sum of the second main node and the third main node then results in a zero in the second main node, and a maximum of a one in the third main node. The subsequent sum of it the first main node (one) and the second main node (zero) results in a zero in the first main node and a one in the second main node.

By applying the third basic process to the third single-electron transistor, the signal charge located at the third main node is shifted to the first main node of the adjacent circuit block, which reliably contains a zero after carrying out the first basic process, the second basic process and the first basic process. The third main node is now provided with a zero. By applying the third basic process to the second single-electron transistor, the signal charge is shifted from the second main node to the third main node, so that the second main node is now provided with a zero. By applying the third basic process to the first single-electron transistor, the signal charge located at the first main node, which was stored at the third main node of the adjacent circuit block after carrying out the first basic process, the second basic process and the first basic process, is shifted to the second main node. After this operation, the first main node is provided with a zero.

In the next step, the signal charge for the next digit of the second binary number is applied to the first main node, this signal charge depending on the product of this digit of the second binary number and the corresponding digit of the first binary number. The procedure is carried out as described above for all the digits of the second binary number.

After processing all the digits of the second binary number, the further binary digits of the product are produced successively at the output by alternating application of the second basic process and of the third basic processes carried out in the block to the third single-electron transistor, to the second single-electron transistor and to the first single-electron transistor.

Other features which are considered as characteristic for the invention are set forth in the appended claims.

Although the invention is illustrated and described herein as embodied in a circuit configuration having single-electron components, and a method for its operation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figures.

BRIEF DESCRIPTION OF THE DRAWINGS

FIG. 2, which is divided into FIGS. 2A, 2B and 2C, shows a circuit configuration with three circuit blocks, which each has six single-electron transistors.

DESCRIPTION OF THE PREFERRED EMBODIMENTS

Figure 1:
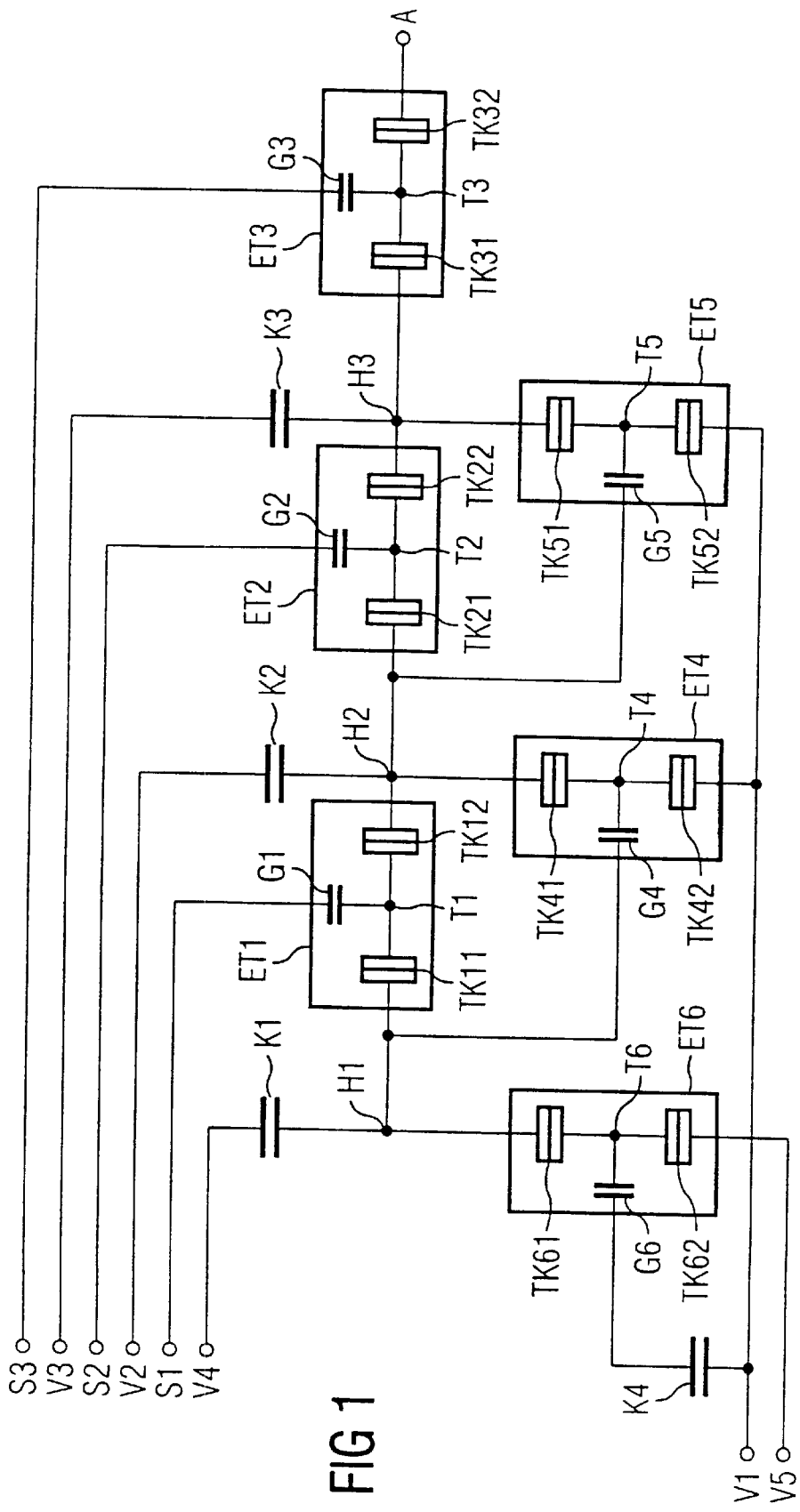
FIG. 1 is a circuit schematic showing a circuit configuration with a circuit block having six single-electron transistors.

Referring now to the figures of the drawing in detail and first, particularly, to FIG. 1 thereof, there is seen a circuit configuration with six single-electron transistors, of which the $i^{th}$ single-electron transistor ETi, i=1, 2, 3, 4, 5, 6 has a tunnel element Ti which is connected to connections via two tunneling contacts TKi1, TKi2 and can be influenced capacitively via a gate electrode Gi. The tunneling contacts TKi1, TKi2, i=1, 2, 3 of the first single-electron transistor ET1, of the second single-electron transistor ET2, and of the third single-electron transistor ET3 in this case each have a capacitance of 0.25 aF.

The first tunneling contacts TKi1, i=4, 5 of the fourth single-electron transistor ET4 and of the fifth single-electron transistor ET5 in this case each have a capacitance of 0.3 aF. The second tunneling contacts TKi2, i=4, 5 of the fourth single-electron transistor and of the fifth single-electron transistor in this case each have a capacitance of 0.1 aF. The first tunneling contact TK61 of the sixth single-electron transistor ET6 has a capacitance of 0.4 aF, the second tunneling contact TK62 of the sixth single-electron transistor ET6 has a capacitance of 0.1 aF. The gate electrode Gi, i=1, 2, 3 of the first single-electron transistor ET1, of the second single-electron transistor ET2 and of the third single-electron transistor ET3 in each case has a capacitance of 0.4 aF. The gate electrode G4, G5 of the fourth single-electron transistor ET4 and of the fifth single-electron transistor ET5 in each case has a capacitance of 0.2 aF. The gate electrode G6 of the sixth single-electron transistor ET6 has a capacitance of 0.2 aF.

The first single-electron transistor ET1, the second single-electron transistor ET2 and the third single-electron transistor ET3 are connected in series between a first main node H1 and an output A. In this case, the first electron transistor ET1 is connected between the first main node H1 and a second main node H2. The second single-electron transistor ET2 is connected between the second main node H2 and a third main node H3. The third single-electron transistor ET3 is connected between the third main node H3 and the output A.

The fourth single-electron transistor ET4 is connected between the second main node H2 and a first supply voltage connection V1, with the gate electrode G4 of the fourth single-electron transistor ET4 being connected to the first main node H1. The second main node H2 is connected via a second capacitor K2 having a capacitance of 1 aF to a second supply voltage connection V2.

The fifth single-electron transistor ET5 is connected between the third main node H3 and the first supply voltage connection V1, with its gate electrode GS being connected to the second main node H2. The third main node H3 is connected via a third capacitor K3 having a capacitance of 1 aF to a third supply voltage connection.

The first main node H1 is connected via a first capacitor K1 having a capacitance of 0.8 aF to a fourth supply voltage connection V4.

The sixth single-electron transistor ET6 is connected between the first main node H1 and a fifth supply voltage connection V5, with its gate electrode G6 being connected via a fourth capacitor K4 having a capacitance of 0.2 aF to the first supply voltage connection V1.

Since the gate electrode G4 of the fourth single-electron transistor ET4 is connected to the first main node H1, and the gate electrode GS of the fifth single-electron transistor ET5 is connected to the second main node H2, the conductivity of the fourth single-electron transistor ET4 and of the fifth single-electron transistor ET5—respectively—is dependent on the amount of charge located in the first main node H1 and the second main node H2, respectively, which are in turn associated with a logic value. Thus, this circuit configuration makes it possible to produce links between values whose associated amount of charge is stored in the first main node H1, in the second main node H2 and in the third main node H3.

Furthermore, an amount of charge corresponding to a logic value can be stored between the fourth capacitor K4 and the gate electrode G6 of the sixth single-electron transistor ET6, and this amount of charge influences the conductivity of the sixth single-electron transistor ET6. In this way, the first main node H1 can be charged as a function of the variable stored in the gate electrode G6.

The first capacitor K1 and/or the fourth capacitor K4 may alternatively be in the form of a capacitance, in particular a single-electron component, a single-electron transistor, or a complex circuit with the stated total capacitance.

Figure 2C:
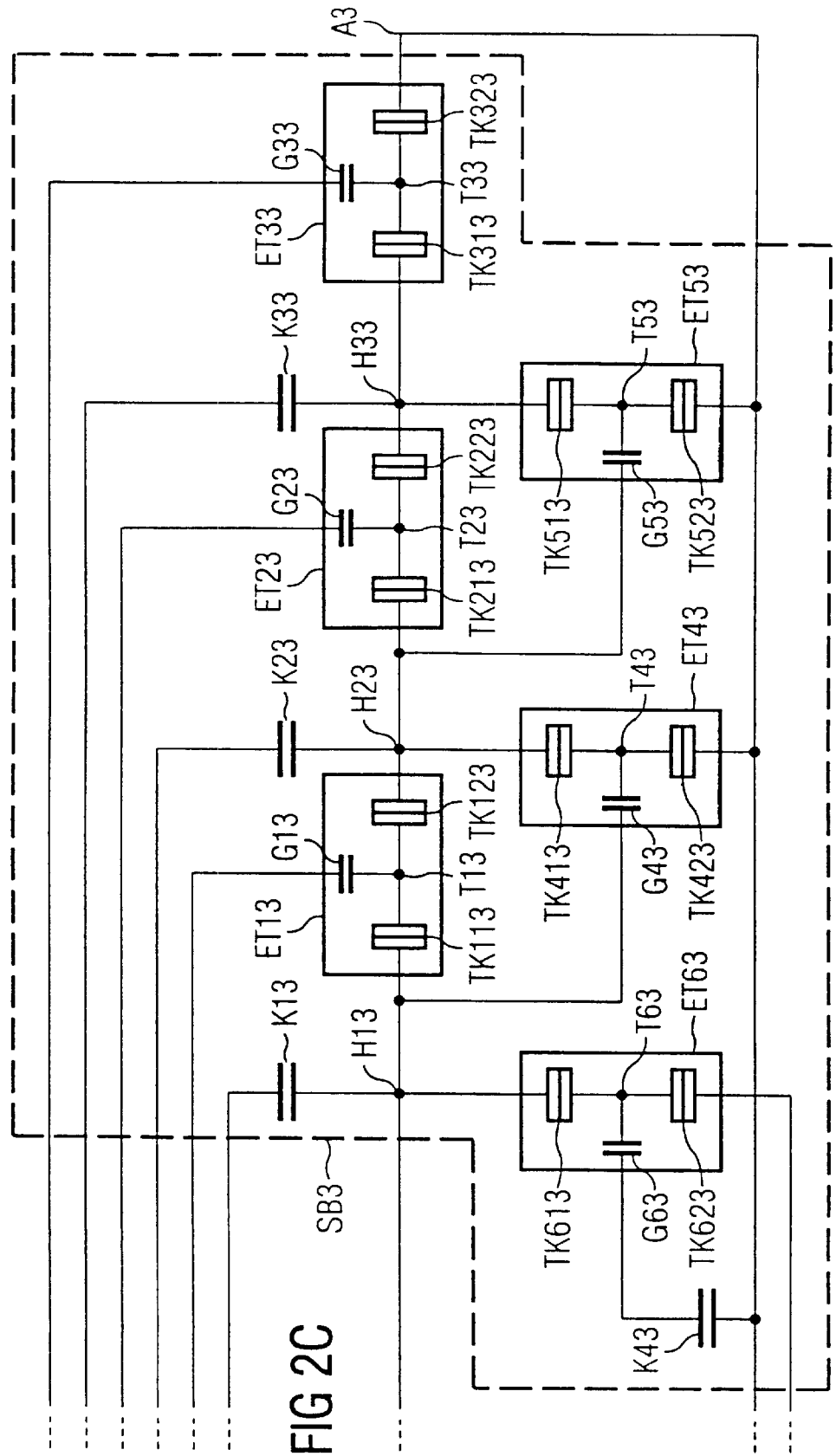

Referring now to FIG. 2 (FIGS. 2A, 2B, 2C), a circuit configuration has three circuit blocks SBj, j=1, 2, 3, each of which is constructed in an analogous way to the circuit configuration described with reference to FIG. 1. Each of the circuit blocks SBj has six single-electron transistors ETij, i=1 to 6, j=1 to 3, which are connected in a corresponding manner to that shown in FIG. 1. Analogously to FIG. 1, each of the single-electron transistors ETij, i=1 to 6, j=1 to 3 has a tunnel element Tij, tunneling contacts TKikj and a gate electrode Gij, i=1 to 6, j=1 to 3, k=1, 2.

The first single-electron transistor ET1j, the second single-electron transistor ET2j and the third single-electron transistor ET3j are connected via a second main node H2j and a third main node H3j between a first main node H1j and an output Aj. The output Aj of a circuit block SBj is in this case connected to the first main node H1j+1 of the adjacent circuit block SBj+1, j=1, 2. The output A3 of the third circuit block SB3 forms the output of the circuit configuration.

The gate electrode G1j of the first single-electron transistor ET1j is in each case connected to a first control voltage connection ST1. The gate electrode G2j of the second single-electron transistor ET2j is in each case connected to a second control voltage connection ST2. The gate electrode G3j of the third single-electron transistor ET3j is in each case connected to a third control voltage connection ST3. The first main node H1j is in each case connected to a fourth supply voltage connection VS4 via a first capacitor K1j. The second main node H2j is in each case connected to a second supply voltage connection VS2 via a second capacitor K2j. The third main node H3j is in each case connected to a third supply voltage connection VS3 via a third capacitor K3j. The gate electrode G4j of the fourth single-electron transistor ET4j is in each case connected to the first main node H1j. The gate electrode G5j of the fifth single-electron transistor ET5j is in each case connected to the second main node H2j. The fourth single-electron transistor ET4j is in each case connected between the second main node H2j and a first supply voltage connection VS1. The fifth single-electron transistor ET5j is in each case connected between the third main node H3j and the first supply voltage connection VS1.

The sixth single-electron transistor ET6j is in each case connected between the first main node H1j and a fifth supply voltage connection VS5. The gate electrode G6j of the sixth single-electron transistor ET6j is in each case connected via a fourth capacitor K4j to the first supply voltage connection VS1.

The output A3 of the third circuit block SB3 is connected to the first supply voltage connection VS1.

With the exception of the second tunneling contact TK323 of the third single-electron transistor ET33 of the third circuit block SB3, the electrical dimensions of all the features correspond to those in FIG. 1. The capacitance of the second tunneling contact TK323 lies at 0.2 aF (see FIG. 2).

The circuit configuration described with reference to FIG. 2 is suitable for multiplication of two three-digit binary numbers. An example of the multiplication of two three-digit binary numbers will be explained in the following text with reference to FIGS. 3A to 3P. The term "charge carrier" is thereby used for excess charge carriers.

The digits of a first binary number are applied to the gate electrode G6j of the sixth single-electron transistor ET6j in the form of a signal charge which corresponds to the value 1 or 0. For the value 1, an electron acts on the gate electrode G6j, while for the value zero no electron acts on this gate electrode G6j. The multiplication by the digits of the second binary number takes place by applying to the fifth supply voltage connection VS5 a voltage which corresponds to the value of the corresponding digit, zero or one. The various digits in the second binary number are considered successively during the course of the method. The voltages are of such a magnitude that an electron flows to the first main node H1j via the sixth single-electron transistor ET6j if the second binary number digit has the value 1 and provided the value one of the first binary number digit is acting on the gate electrode G6j. When the second binary number digit has the value zero, the voltage is of such a magnitude that no electron flows via the sixth single-electron transistor ET6j to the first main node H1j.

A combination of the following steps is required for multiplication:
1. Multiplication of the digits of the first binary number by the digits of the second binary number.
2. Sum of the values stored at the first main node H1j and at the second main node H2j.
3. Sum of the values stored in the second main node H2j and in the third main node H3j.
4. Shifting of the value from the first main node H1j to the second main node H2j.
5. Shifting of a value from a main node H1j, H2j, H3j to the adjacent memory node H2j, H3j, H1j+1 via the single-electron transistor ET1j, ET2j, ET3j arranged in between.

In the first step, an operation 01 is carried out to multiply the digit of the second binary number by the value 0, and an operation 02 is carried out to multiply the digit of the second binary number by the value 1.

The second step, which is also referred to as the first basic process in this description, is composed of three operations 03, 04 and 05. In operation 03, charge carriers located at the first main node H1j flow to the second main node H2j, provided there are not already any charge carriers at the second main node H2j. If there are charge carriers at the second main node H2j, then charge carriers located at the first main node H1j flow, during operation 03, to the tunnel element T1j of the first single-electron transistor ET1j.

In operation 04, charge carriers located at the tunnel element T1j of the first single-electron transistor ET1j flow to the first main node H1j.

In operation 05, charge carriers located at the second main node H2j flow away via the fourth single-electron transistor ET4j, provided there are charge carriers at the first main node H1j.

The third step, which is also referred to as the second basic process in this application, likewise requires three operations 06, 07, 08.

In operation 06, charge carriers located at the second main node H2j flow to the third main node H3j, provided no charge carriers are already located at the third main node H3j, and to the tunnel element T2j of the second single-electron transistor ET2j, provided there are charge carriers at the third main node H3j.

In operation 07, charge carriers flow from the tunnel element T2j of the second single-electron transistor ET2j to the second main node H2j.

In operation 08, charge carriers located at the third main node H3j flow away via the fifth single-electron transistor ET5j, provided there are charge carriers at the second main node H2j.

In the fourth step, charge carriers located at the first main node H1j are shifted to the second main node H2j, in an operation 09. Since the value zero is stored at one of the two main nodes, this corresponds to the use of the first basic process.

The fifth step, which is also referred to as the third basic process in this application, contains three possible operations 010, 011, 012 corresponding to the application of the third basic process to the third single-electron transistor ET3j, the application of the third basic process to the second single-electron transistor ET2j, and the application of the third basic process to the first single-electron transistor, ET1j.

In operation 010, a charge carrier is shifted from the third main node, H3j to the first main node H1j+1 of the adjacent circuit block SBj+1, j=1, 2 or to the output A of the third circuit block SB3.

In operation 011, charge carriers are shifted from the second main node H2j to the third main node H3j.

In operation 012, charge carriers are shifted from the first main node H1j to the second main node H2j.

In order to carry out the operations 0n, n=1 to 12, the supply voltage connections VS1, VS2, VS3, VS4, VS5 and the control voltage connections ST1, ST2, ST3 each have the voltage levels shown in Table 1 applied to them.

TABLE 1

| Opera-tion | VS1/ mV | VS5/ mV | VS4/ mV | ST1/ mV | VS2/ mV | ST2/ mV | VS3/ mV | ST3/ mV |
| --- | --- | --- | --- | --- | --- | --- | --- | --- |
| 01 | 0 | −170 | −70 | −90 | 30 | −50 | −60 | −90 |
| 02 | 0 | −100 | 120 | 40 | 40 | 30 | 30 | 40 |
| 03 | 0 | −170 | −80 | 30 | 0 | −40 | −60 | −80 |
| 04 | 0 | −150 | −50 | −10 | −10 | −40 | −50 | −60 |
| 05 | 0 | −170 | −60 | −70 | −90 | −70 | 0 | −100 |
| 06 | 0 | −160 | −50 | −60 | −50 | 120 | 30 | −100 |
| 07 | 0 | −170 | −70 | −80 | −50 | −70 | −40 | −80 |
| 08 | 0 | −170 | −70 | −80 | −80 | −80 | −90 | −60 |
| 09 | 0 | −170 | −80 | 30 | 0 | −40 | −60 | −80 |
| 010 | 0 | −130 | −20 | −40 | −4 | −49 | −125 | 19 |
| 011 | 0 | −160 | −50 | −60 | −50 | 120 | 30 | −100 |
| 012 | 0 | −170 | −80 | 30 | 0 | −40 | −60 | −80 |

Figure 3A:
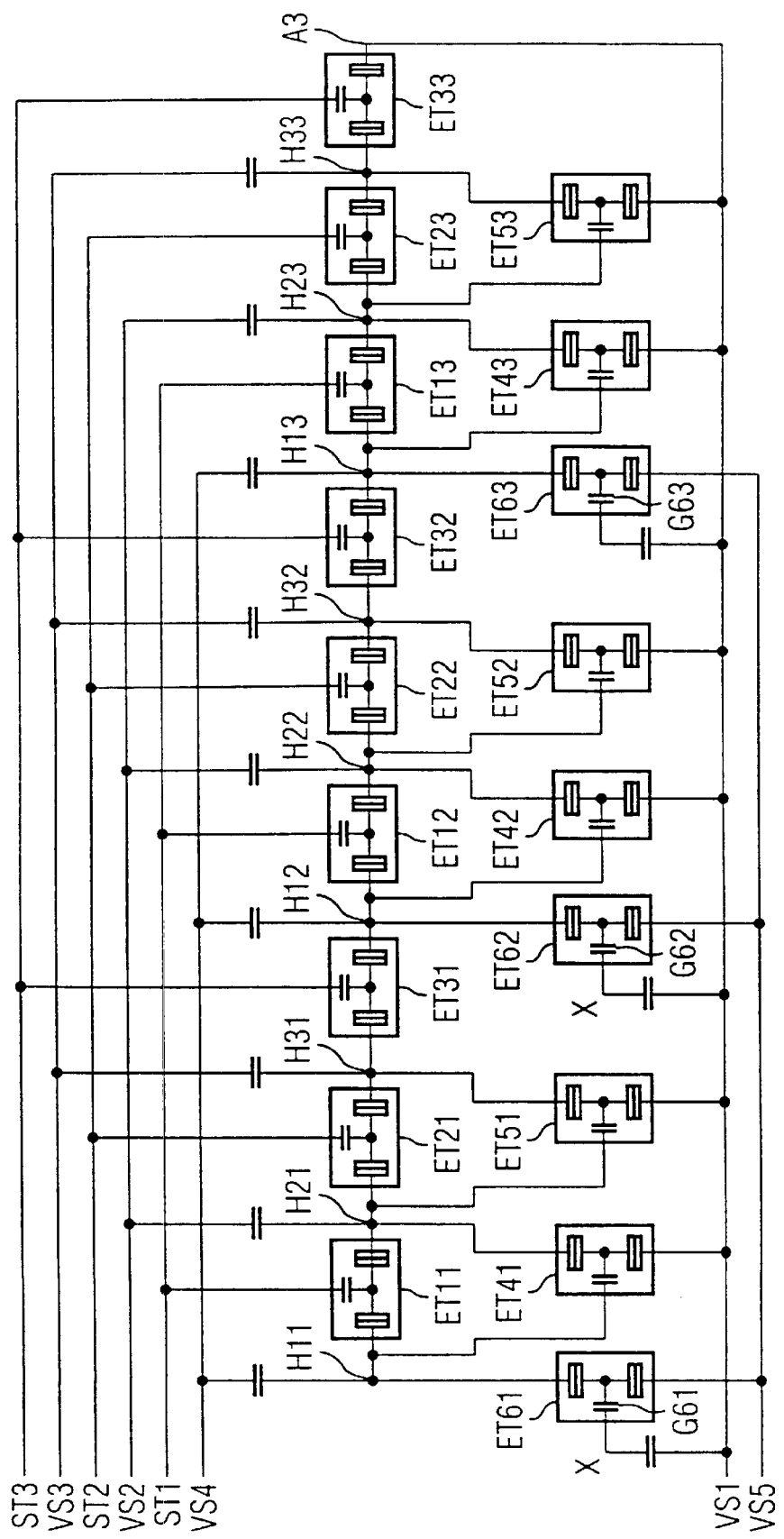
FIGS. 3A to 3P are schematic diagrams showing the circuit configuration of FIG. 2 during a multiplication of two binary numbers.

FIGS. 3a to 3p each show only those reference symbols which are important for explanation of the method. The symbol X in FIGS. 3a to 3p denotes where an electron is stored.

In order to multiply the first binary number 110 by the second binary number 111, a signal charge corresponding to one digit of the first binary number is in each case applied to the gate electrode G6j of the sixth single-electron transistor ET6j. An on corresponding to a one is applied to the gate electrode G61, an electron corresponding to a one is applied to the gate electrode G62, and no electron (corresponding to a zero) is applied to the gate electrode G63 (See FIG. 3A).

Figure 3B:
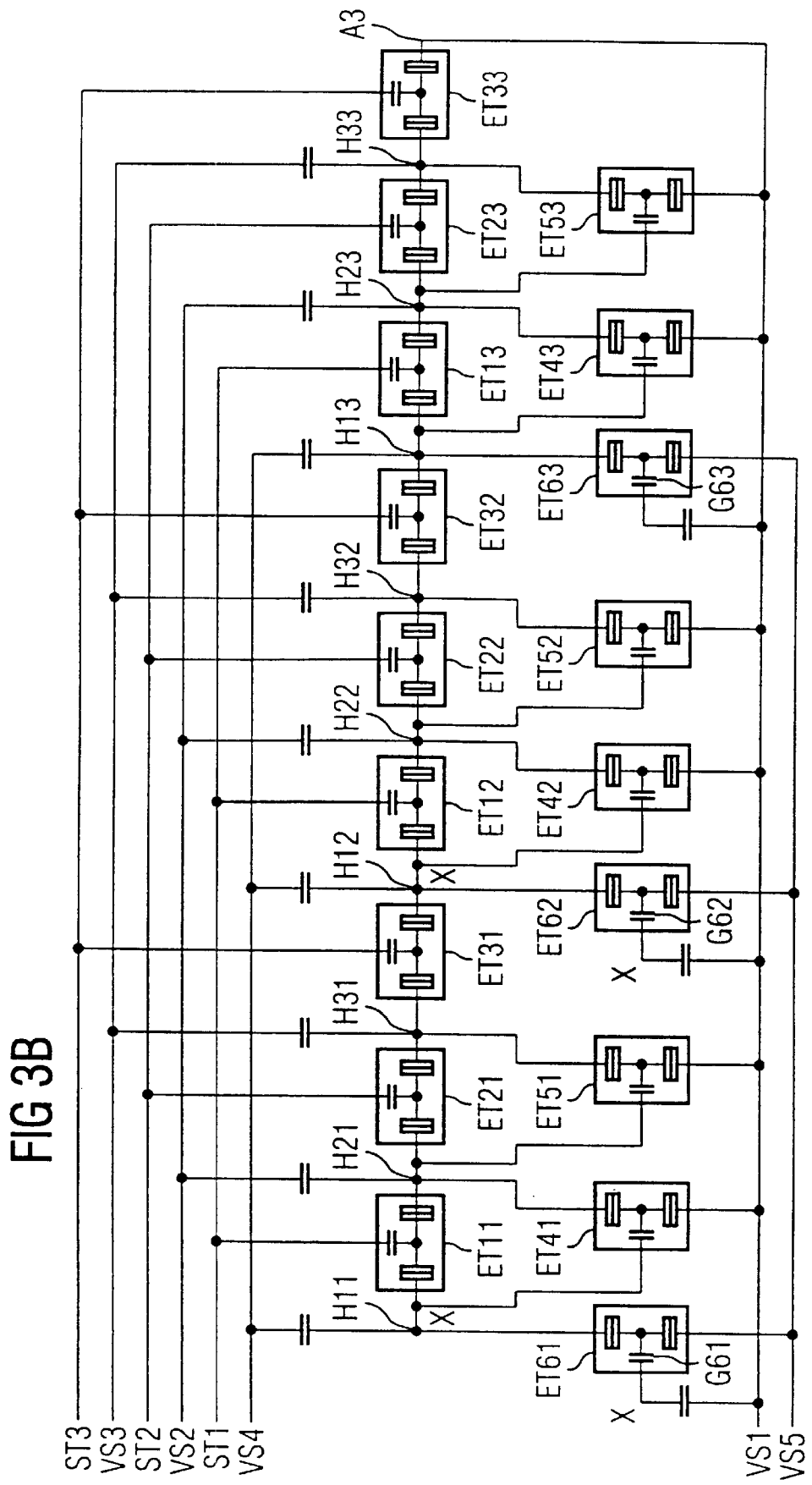

The multiplication by the first digit of the second binary number, which has the value 1, now takes place. This multiplication is carried out by use of the operation 02. This results in an electron passing in each case to the first main node H11 and to the first main node H12 (see FIG. 3B).

Figure 3C:
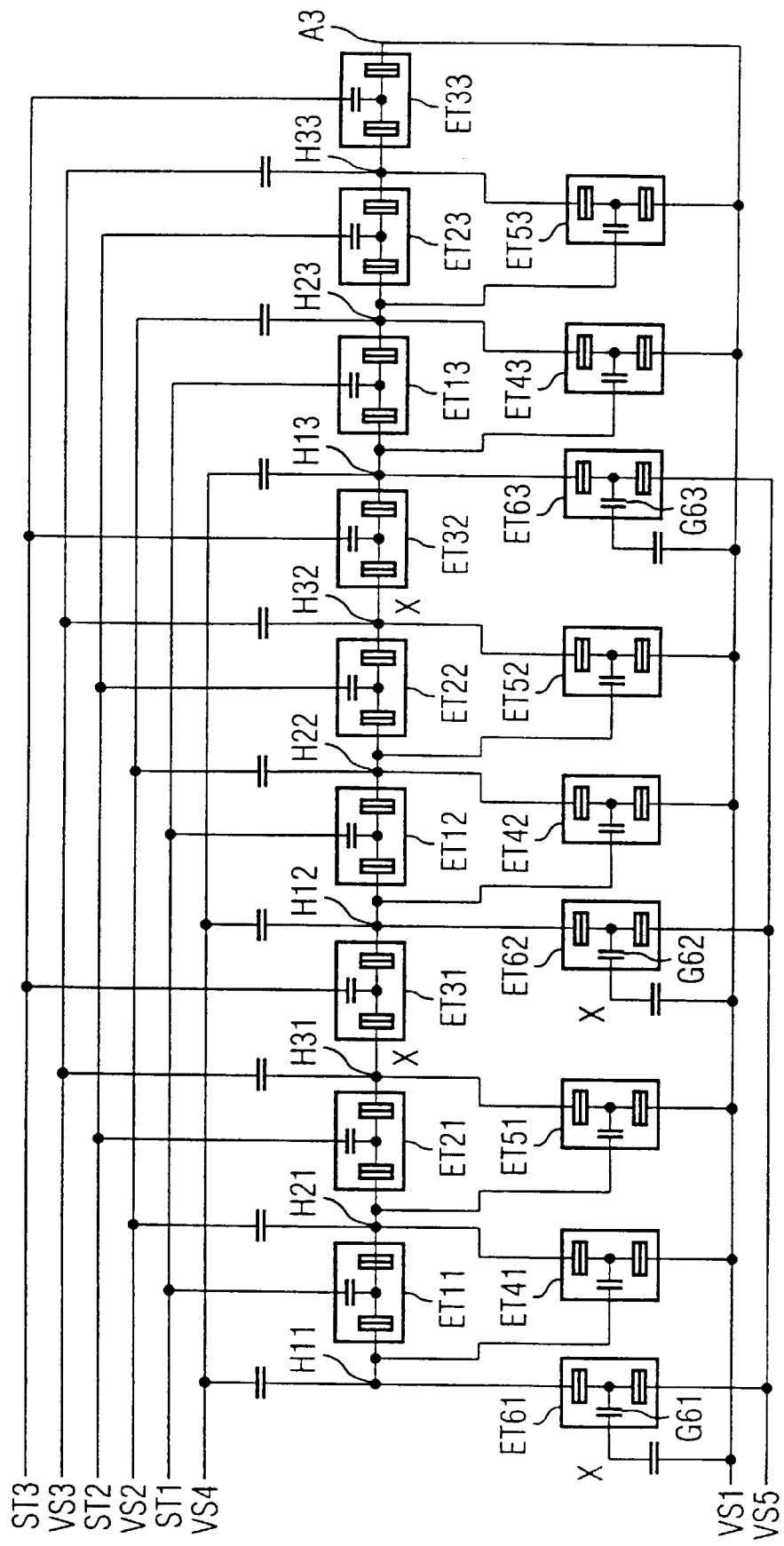

By successive use of the first basic process (03, 04, 05), the second basic process (06, 07, 08) and the operation 09, an electron passes from the first main node H11 to the third main node H31, and from the first main node H12 to the third main node H32 (see FIG. 3C).

Figure 3D:
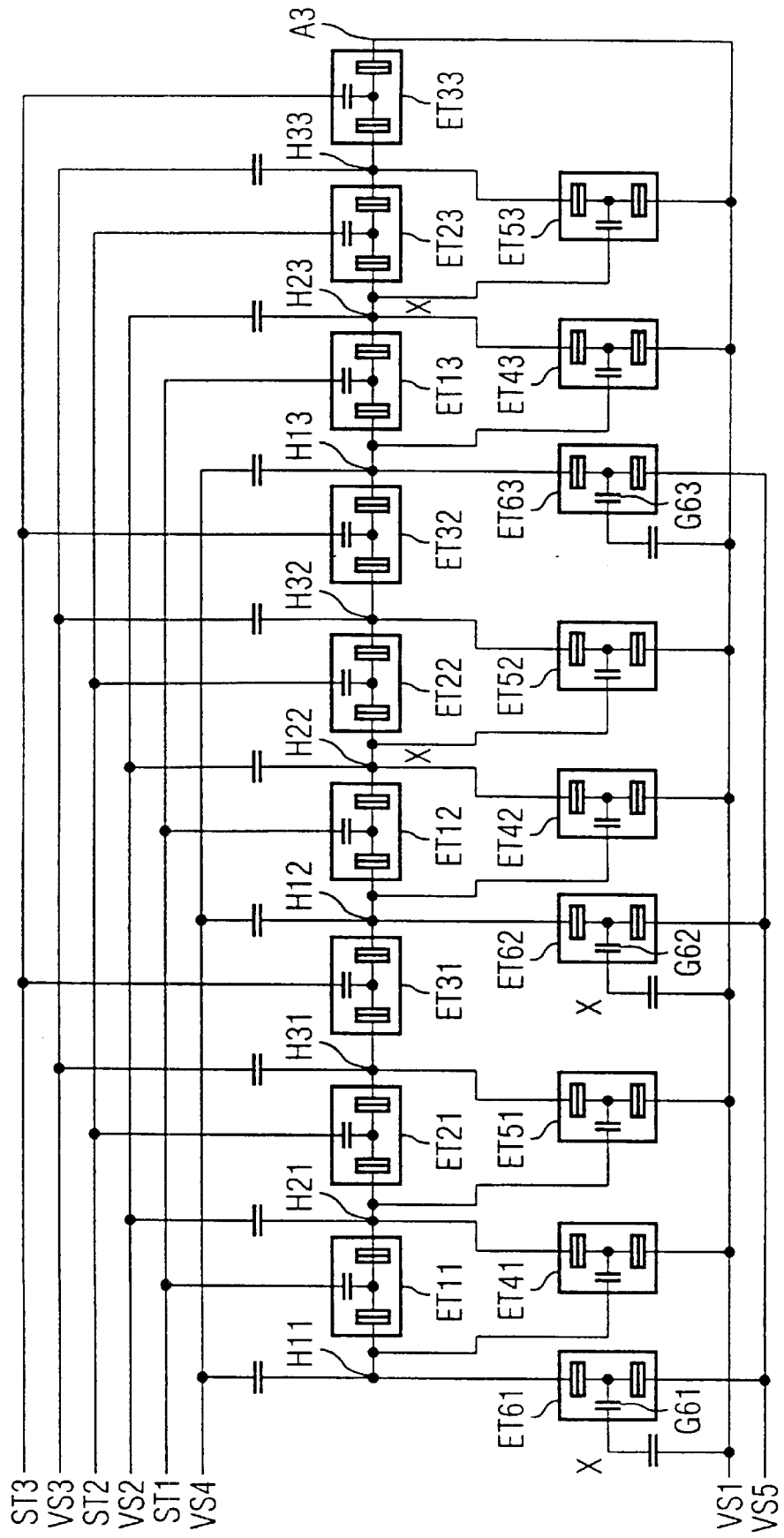

By use of the operations 010, 011, 012 an electron is shifted from the third main node H31 to the second main node H22, and an electron is shifted from the third main node H32 to the second main node H23. At the same time, the process detects what charge is flowing via the output A3. No current flows via the output A3, corresponding to the value zero of the digit with the significance $2^0$ the result (see FIG. 3D).

Figure 3E:
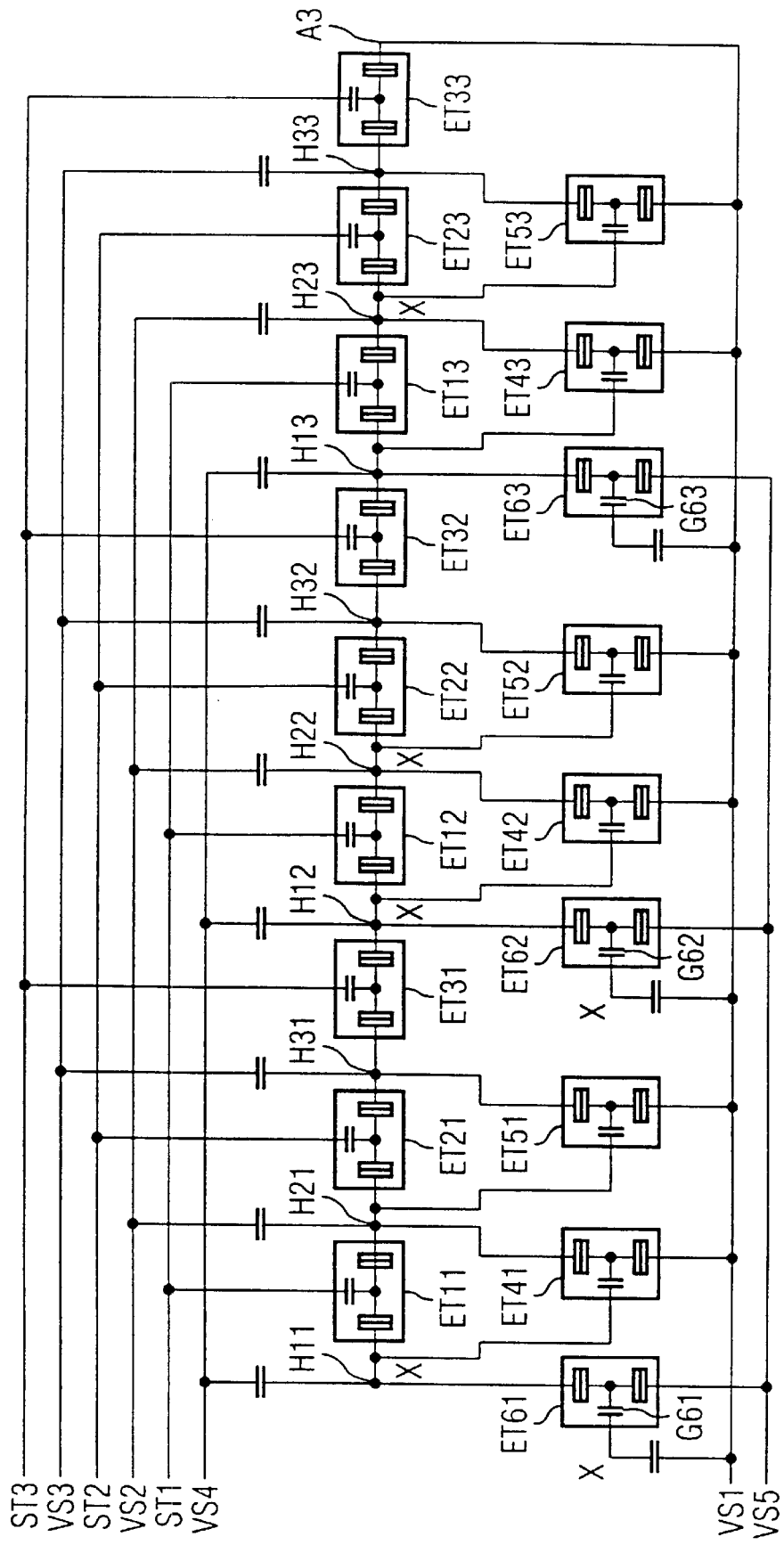

By use of the operation 02, that digit of the first binary number which is stored at the gate electrode, G6j of the sixth single-electron transistor ET6j is in each case multiplied by the second digit of the second binary number, which has the value 1. In consequence, an electron is in each case passed to the first main node H11 and to the second main node H12 (see FIG. 3E).

Figure 3F:
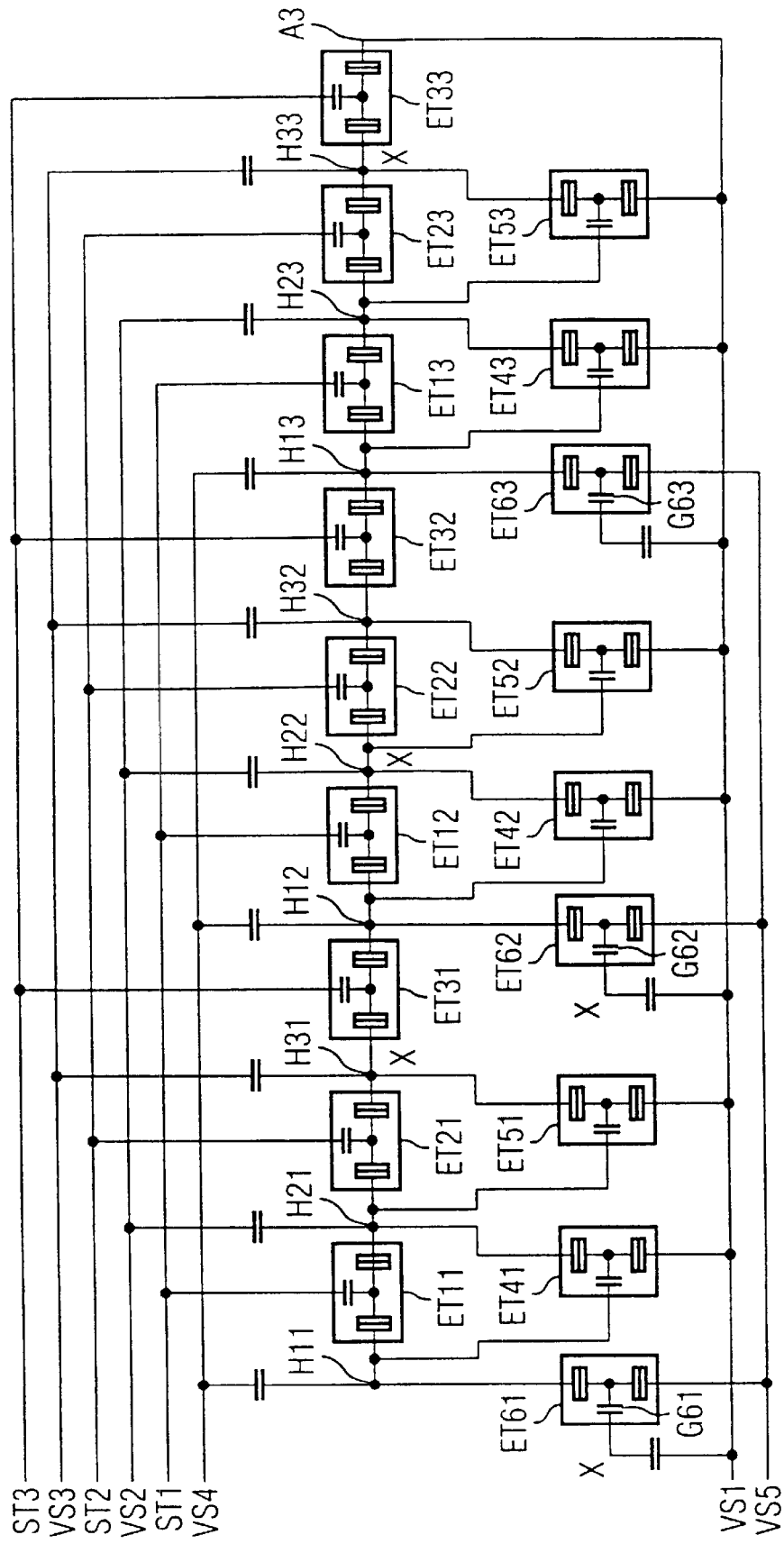

Use of the first basic process (operation 03, 04, 05), the second basic process (operation 06, 07, 08) and operation 09 results in the situation shown in FIG. 3f, in which an electron is in each case stored at the third main node H31, at the second main node H22 and at the third main node H33.

Figure 3G:
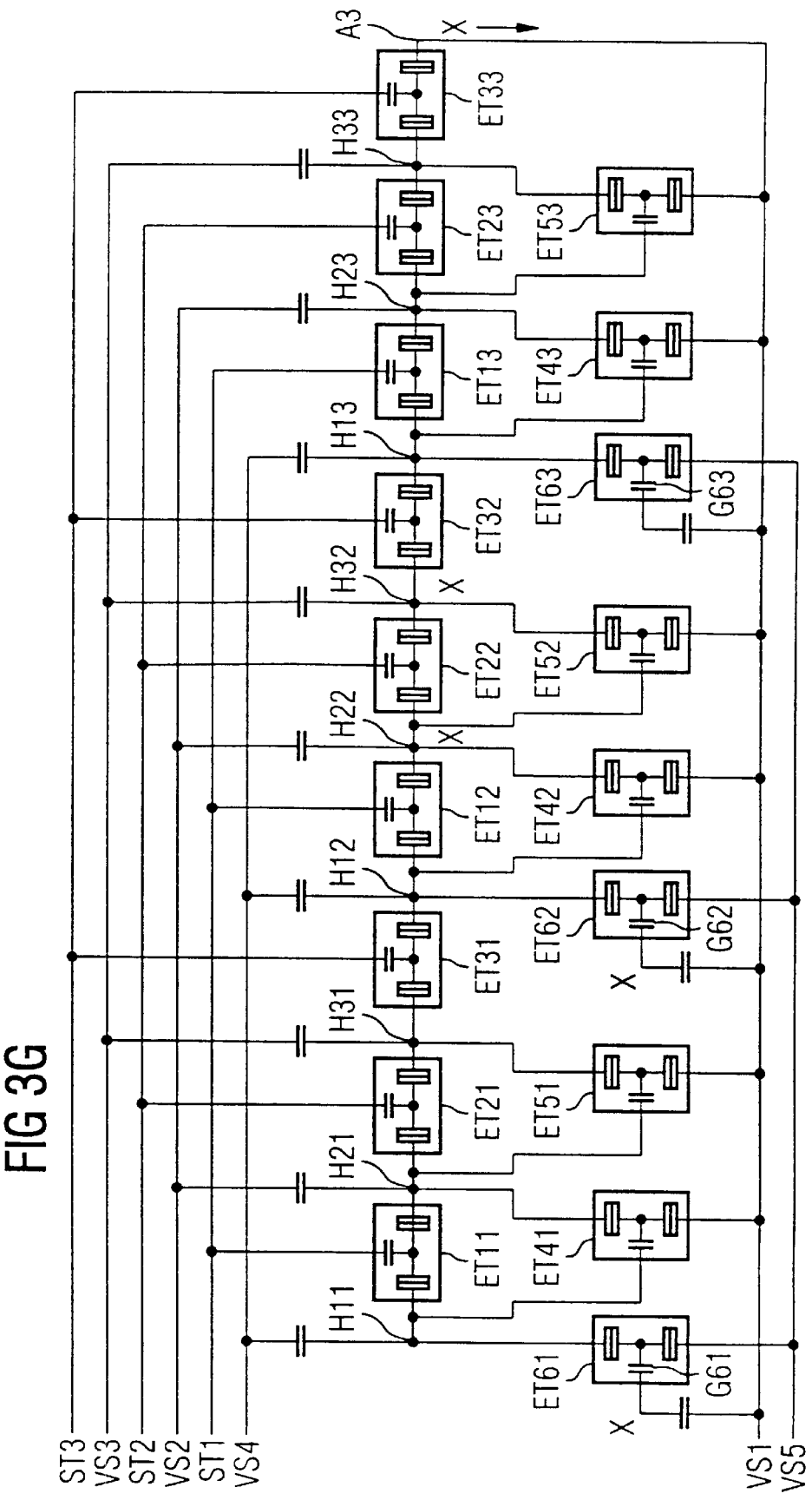

After carrying out the operations 010, 011, 012, an electron is located at the second main node H22, and an electron is located at the third main node H33. An electron has flowed via the output A3, corresponding to the digit with the significance $2^1$ in the result (see FIG. 3G).

Figure 3H:
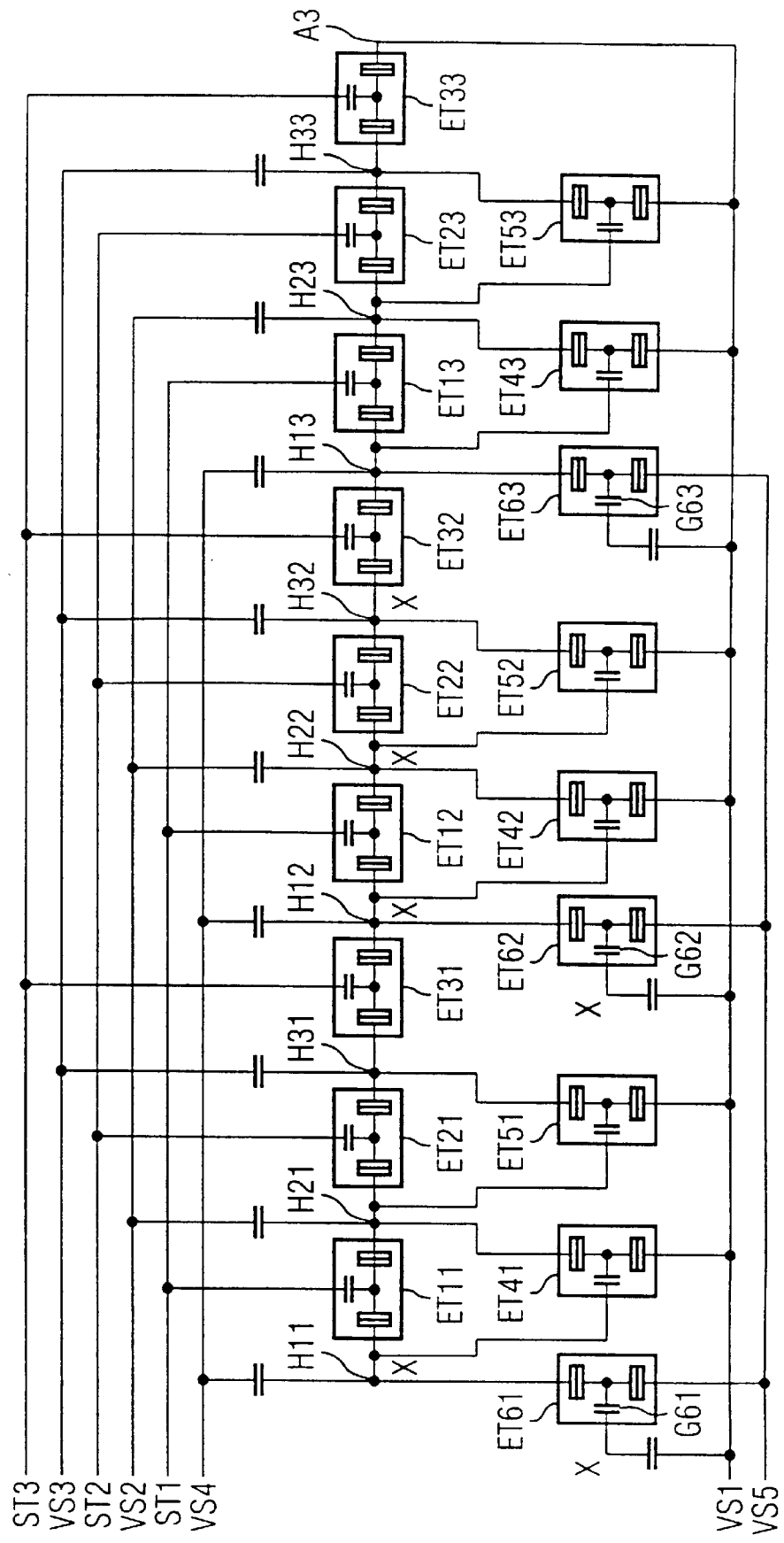

Use of the operation 02 results in the digits of the first binary number in each case being multiplied by the third digit of the second binary number, which has the value one. In consequence, an electron is in each case located at the first main node H11, at the first main node H12, at the second main node H22 and at the third main node H32 (see FIG. 3H).

Figure 3I:
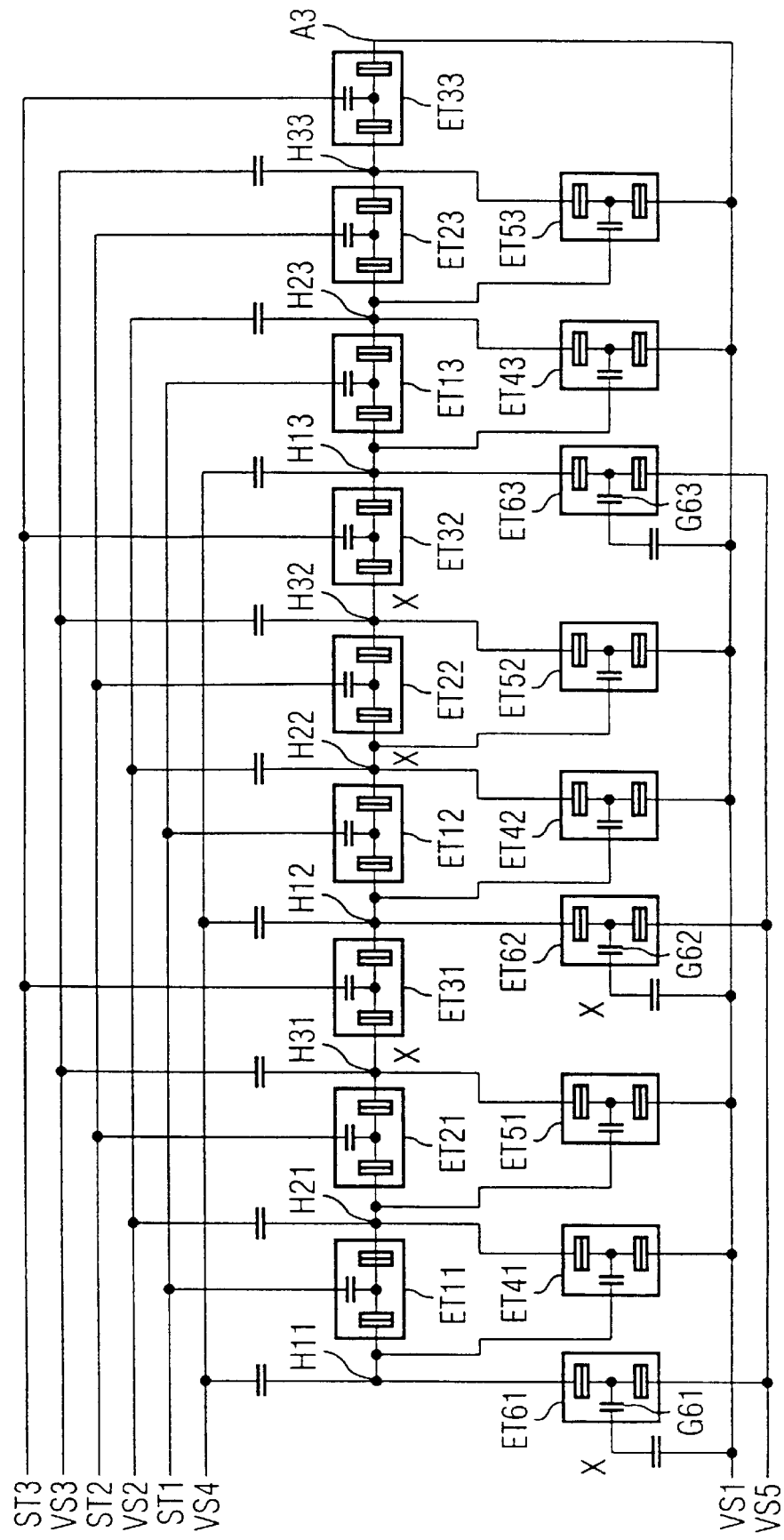

Use of the first basic process and of the second basic process (operations 03, 04, 05, 06, 07, 08) and operations 09 result in an electron in each case being located at the third main node H31, at the second main node H32 and at the third main node H32 (see FIG. 3I).

Figure 3J:
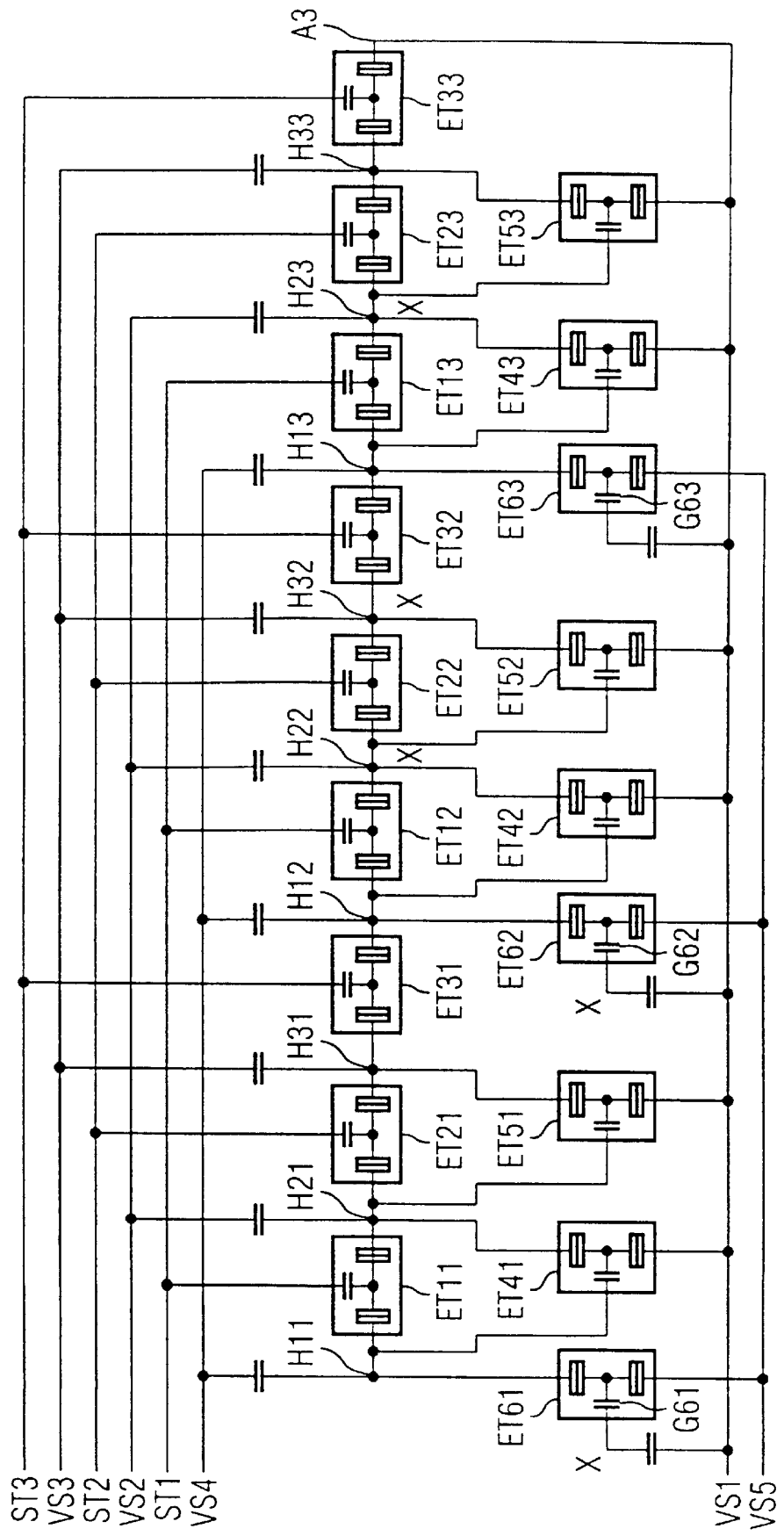

Use of the operations 010, 011, 012 results in an electron in each case being located at the second main node H22, at the third main node H32 and at the second main node H23 (see FIG. 3j). During this process, no electron has flowed via the output A3, corresponding to the value zero of the digit with the significance 22 in the result.

Figure 3K:
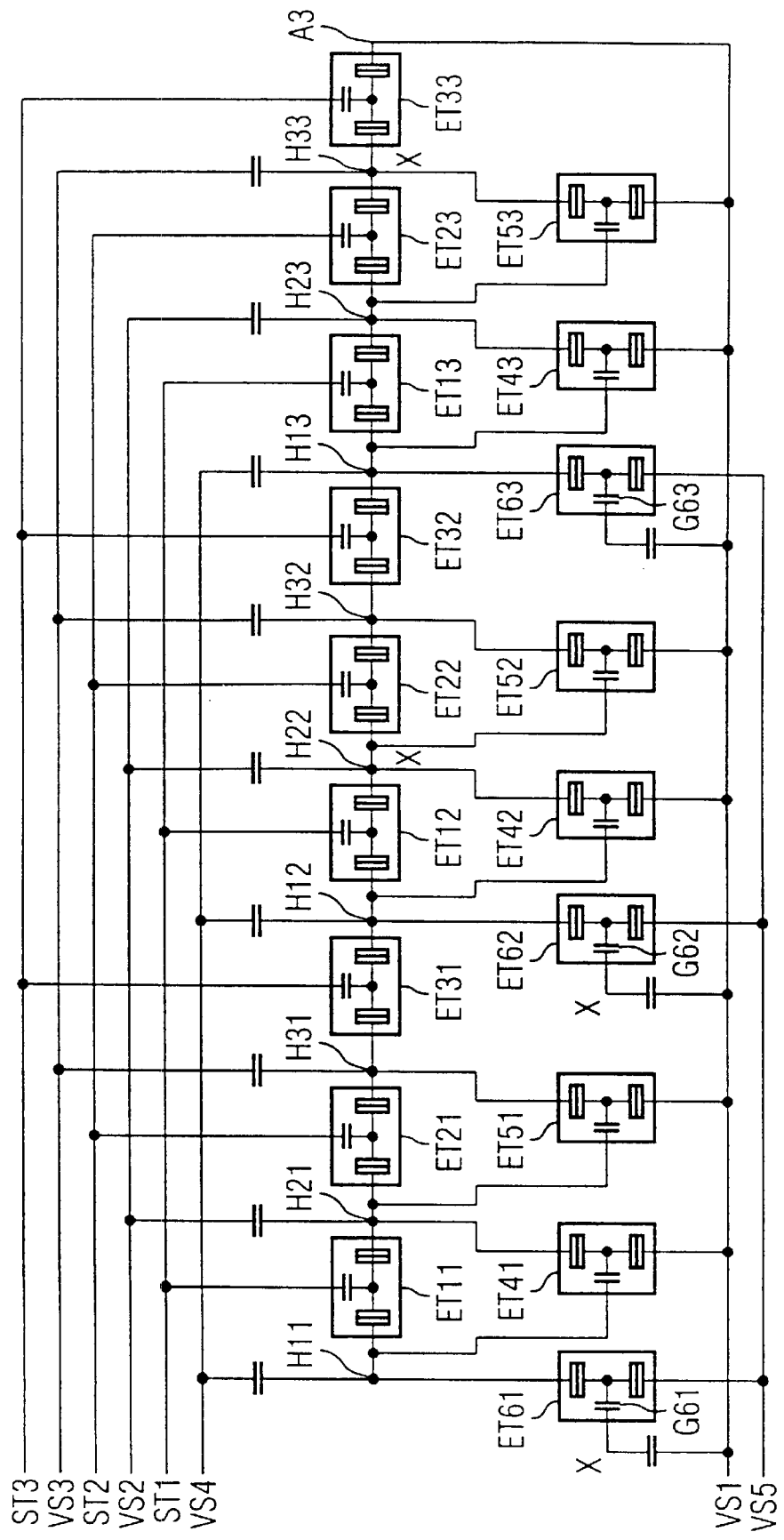

Use of the second basic process (operations 06, 07, 08) results in an electron in each case being located at the second main node H22 and at the third main node H33 (see FIG. 3K).

Use of the operations 010, 011, 012 results in an electron being located at the third main node H32. At the same time, an electron flows via the output A3, corresponding to the value 1 of the digit with the significance 23 in the result (see FIG. 3L).

Use of the second basic process (operations 06, 07, 08) results in an electron being located at the third main node H32 (see FIG. 3M).

Figure 3N:
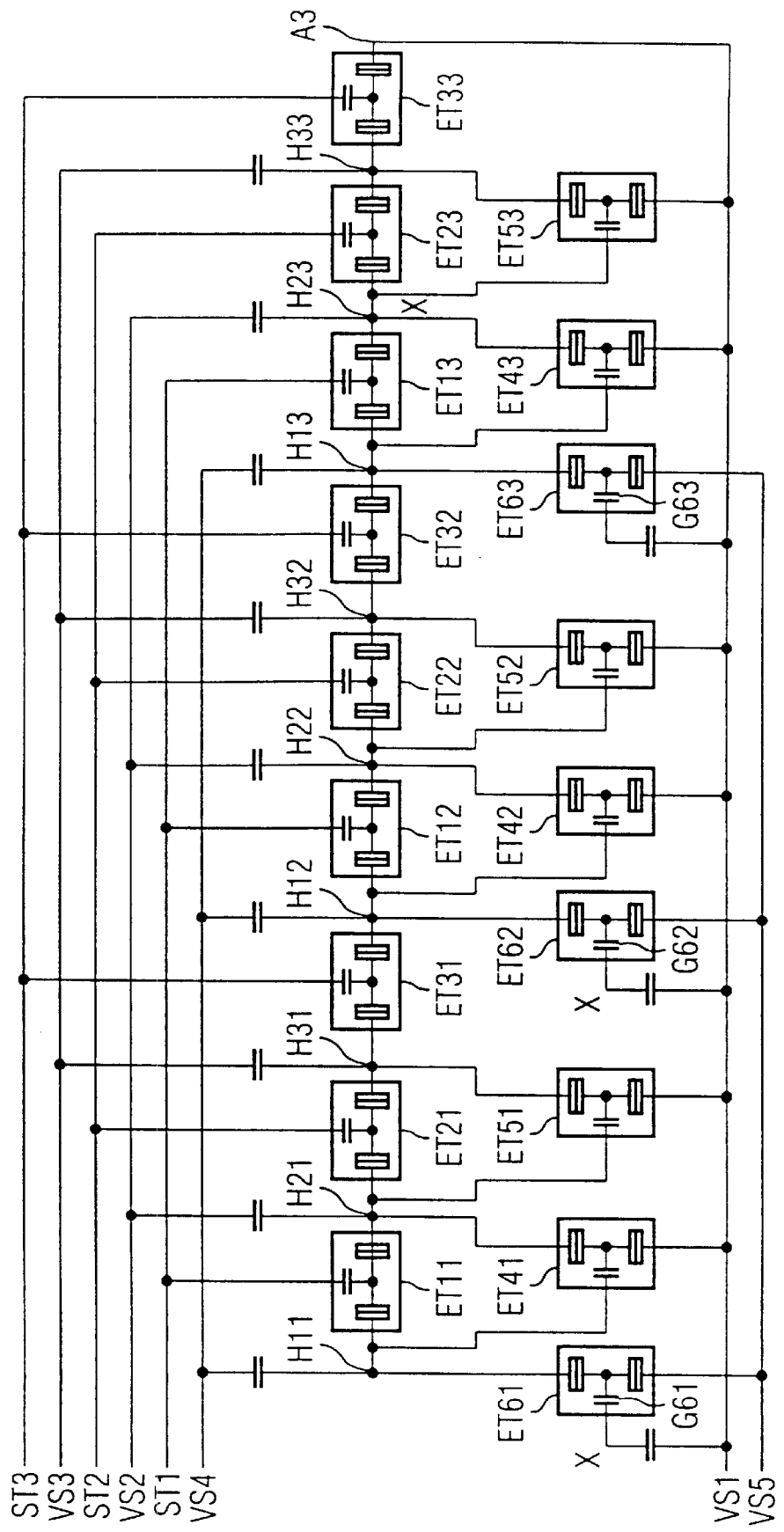
Figure 30:
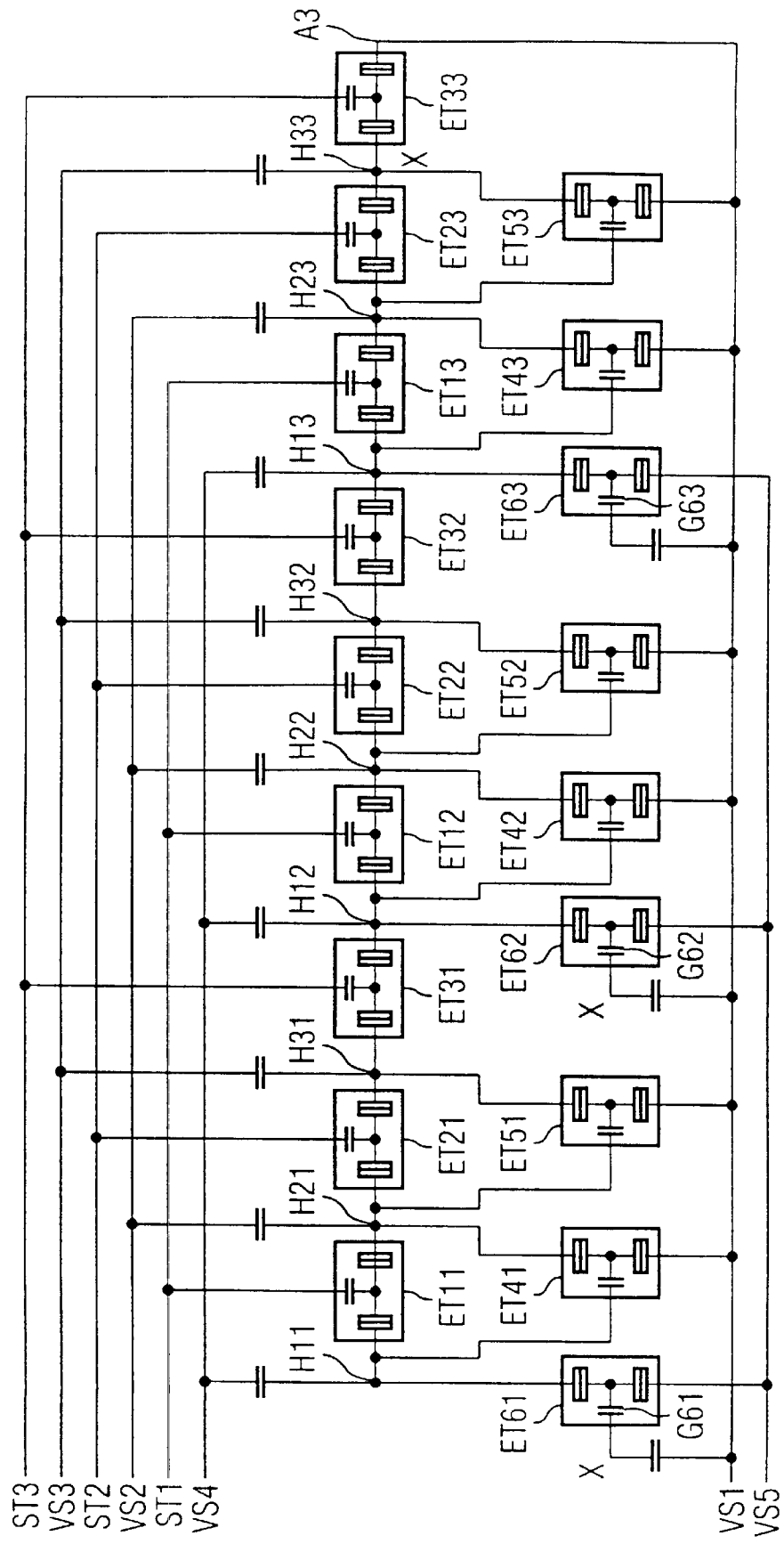

Use of the operations 010, 011, 012 results in an electron being located at the second main node H23. At the same time, no electron flows via the output A3, corresponding to the value zero of the digit with the significant 24 in the result (see FIG. 3N).

The second basic process (operations 06, 07, 08) is then carried out, so that an electron is located at the third main node H33 (see FIG. 3O).

Use of the operations 010, 011, 012 results in an electron flowing via the output A3, corresponding to the value 1 of the digit with the significance $2^5$ in the result. The result of the multiplication is thus 101010.

Numerous variants of the invention are possible. In particular, the fourth capacitor K4J can be replaced by a more complex circuit, a single-electron component or a single-electron transistor.

The process of detecting the result by measurement of the current via the third single-electron transistor ET33 can be carried out in various ways. The signal charge corresponding to the result may be read to a shift register, or may be read out with the aid of a single-electron transistor used as an electrometer amplifier, whose gate electrode is connected to the third main node H33. It will be understood that is not absolutely essential for the output A3 to be connected to the first supply voltage VS1.

The method can also be carried out with voltages other than the stated values. In particular, a more complex circuit can provide an amount of charge at the connection of the sixth single-electron transistor ET6J, such that the amount of charge is dependent on the value of the corresponding digit of the second binary number.

We claim:

1. A circuit configuration with single-electron components, comprising:

a first supply voltage connection, a second supply voltage connection, a third supply voltage connection, a fourth supply voltage connection, a fifth supply voltage connection, an output, a first control voltage connection, a second control voltage connection, and a third control voltage connection;

a circuit block having a first single-electron transistor, a second single-electron transistor, a third single-electron transistor, a fourth single-electron transistor, and a fifth single-electron transistor;

wherein said first single-electron transistor is connected between a first main node and a second main node, said second single-electron transistor is connected between said second main node and a third main node, and said third single-electron transistor is connected between said third main node and said output;

wherein said fourth single-electron transistor is connected between said second main node and said first supply voltage connection, and said fifth single-electron transistor is connected between said third main node and said first supply voltage connection;

wherein said second main node is capacitively connected to said second supply voltage connection, and said third main node is capacitively connected to said third supply voltage connection;

said first single-electron transistor having a gate electrode connected to said first control voltage connection, said second single-electron transistor having a gate electrode connected to said second control voltage connection, and said third single-electron transistor having a gate electrode connected to said third control voltage connection;

said fourth single-electron transistor having a gate electrode connected to said first main node, and said fifth single-electron transistor having a gate electrode connected to said second main node; and wherein said first main node is capacitively connected to said fourth supply voltage connection, a capacitive element is connected between said first main node and said fifth supply voltage connection, and said fifth supply voltage connection is different from said first supply voltage connection.

2. The circuit configuration according to claim 1, which comprises a capacitor connected between said second main node and said second supply voltage connection, an a capacitor connected between said third main node and said third supply voltage connection.

3. The circuit configuration according to claim 1, wherein said capacitive element includes a sixth single-electron transistor connected between said first main node and said fifth supply voltage connection.

4. The circuit configuration according to claim 3, wherein said sixth single-electron transistor has a gate electrode capacitively connected to said first supply voltage.

5. The circuit configuration according to claim 4, which comprises a capacitor connecting said gate electrode of said sixth single-electron transistor to said first supply voltage connection, and a capacitor connecting said first main node to said fourth supply voltage connection.

6. The circuit configuration according to claim 1, wherein said circuit block is one of a plurality of substantially identical circuit blocks connected in series, with said output of one of said circuit blocks connected to said first main node of a respectively adjacent circuit block.

7. A method of operating a circuit configuration, which comprises:

providing a circuit configuration according to claim 1;

applying excess charge carriers to the first main node, to the second main node, and to the third main node in dependence on a logic value of a variable;

logically linking the logic values by performing a combination of basic processes including a first basic process, a second basic process, and a third basic process;

causing, in the first basic process, excess charge carriers located at the first main node to flow to the second main node, provided there are not already any excess charge carriers at the second main node, and excess charge carriers located at the first main node to flow to a tunnel element of the first single-electron transistor, provided there are excess charge carriers at the second main node;

whereupon excess charge carriers located at a tunnel junction of the first single-electron transistor flow to the first main node;

whereupon excess charge carriers located at the second main node flow away via the fourth single-electron transistor only when there are excess charge carriers at the first main node;

causing, in the second basic process, excess charge carriers located at the second main node to flow to the third main node, provided there are not already any excess charge carriers at the third main node, and excess charge carriers located at the second main node to flow to a tunnel element of the second single-electron transistor, provided there are excess charge carriers at the third main node;

whereupon excess charge carriers located at the tunnel element of the second single-electron transistor flow to the second main node;

whereupon excess charge carriers located at the third main node flow away via the fifth single-electron transistor only when there are excess charge carriers at the second main node; and shifting, in the third basic process, excess charge carriers from one main node to an adjacent main node by actuation of the single-electron transistor located between the adjacent main nodes.

8. The method according to claim 7, which comprises:

providing a plurality of substantially identical circuit blocks each having a sixth single-electron transistor connected between the first main node and the fifth supply voltage connection;

multiplying a first binary number by a second binary number by applying digits of the first binary number to a gate electrode of the sixth single-electron transistor of the adjacent circuit blocks;

subsequently applying the digit of the second binary number successively to the first supply voltage connection for all the digits of the second binary number, such that the first main node is provided with a number of charge carriers that depends on a product of the corresponding digits of the binary numbers, performing the first basic process, the second basic process, and the first basic process, and then, by performing the third basic process, shifting excess charge carriers located at the third main node to the second main node of the adjacent circuit block, and shifting excess charge carriers located at the second main node to the third main node of the same circuit block, whereby excess charge carriers located at the third main node of a last circuit block are shifted to the output of the last circuit block as a result for the corresponding binary digit; and producing further binary digits of the product successively at the output, by alternating the second basic process and the third basic process.

* * * * *